(12) United States Patent
Yamazaki

(10) Patent No.: US 9,761,735 B2
(45) Date of Patent: Sep. 12, 2017

(54) MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/205,026

(22) Filed: Jul. 8, 2016

(65) Prior Publication Data

US 2016/0322506 A1 Nov. 3, 2016

Related U.S. Application Data

(63) Continuation of application No. 14/591,043, filed on Jan. 7, 2015, now Pat. No. 9,390,918, which is a
(Continued)

(30) Foreign Application Priority Data

Apr. 23, 2010 (JP) .................................. 2010-100316

(51) Int. Cl.
*H01L 21/02* (2006.01)
*H01L 29/786* (2006.01)
(Continued)

(52) U.S. Cl.
CPC ...... *H01L 29/7869* (2013.01); *H01L 21/0262* (2013.01); *H01L 21/02565* (2013.01);
(Continued)

(58) Field of Classification Search
CPC ................................................ H01L 23/42384
See application file for complete search history.

(56) References Cited

U.S. PATENT DOCUMENTS

| 4,566,913 A * | 1/1986 | Brodsky ............. H01L 21/3105 |
|---|---|---|
| | | 148/DIG. 118 |
| 5,311,040 A | 5/1994 | Hiramatsu et al. |
| | (Continued) | |

FOREIGN PATENT DOCUMENTS

| CN | 100378033 C | 4/2008 |
|---|---|---|
| CN | 101375405 A | 2/2009 |
| | (Continued) | |

OTHER PUBLICATIONS

International Search Report (Application No. PCT/JP2011/059472) Dated Jul. 19, 2011.
(Continued)

*Primary Examiner* — Zandra Smith
*Assistant Examiner* — Andre' C Stevenson
(74) *Attorney, Agent, or Firm* — Fish & Richardson P.C.

(57) ABSTRACT

Disclosed is a semiconductor device using an oxide semiconductor, with stable electric characteristics and high reliability. In a process for manufacturing a bottom-gate transistor including an oxide semiconductor film, dehydration or dehydrogenation is performed by heat treatment and oxygen doping treatment is performed. The transistor including a gate insulating film subjected to the oxygen doping treatment and the oxide semiconductor film subjected to the dehydration or dehydrogenation by the heat treatment is a transistor having high reliability in which the amount of change in threshold voltage of the transistor by the bias-temperature stress (BT) test can be reduced.

8 Claims, 16 Drawing Sheets

Related U.S. Application Data continuation of application No. 13/091,190, filed on Apr. 21, 2011, now Pat. No. 8,945,982.

(51) Int. Cl.
*H01L 27/12* (2006.01)
*H01L 29/40* (2006.01)
*H01L 29/423* (2006.01)
*H01L 29/66* (2006.01)
*H01L 29/417* (2006.01)

(52) U.S. Cl.
CPC .... *H01L 21/02631* (2013.01); *H01L 27/1225* (2013.01); *H01L 29/401* (2013.01); *H01L 29/41733* (2013.01); *H01L 29/42356* (2013.01); *H01L 29/42384* (2013.01); *H01L 29/66969* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,027,977 A | 2/2000 | Mogami |
| 6,294,274 B1 | 9/2001 | Kawazoe et al. |
| 6,342,715 B1 | 1/2002 | Shimizu et al. |
| 6,417,565 B1 | 7/2002 | Komatsu |
| 6,563,174 B2 | 5/2003 | Kawasaki et al. |
| 6,727,522 B1 | 4/2004 | Kawasaki et al. |
| 6,767,694 B2 | 7/2004 | Kido |
| 6,917,096 B2 | 7/2005 | Sugiyama et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,256,147 B2 | 8/2007 | Yamada et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,501,325 B2 | 3/2009 | Matsuura et al. |
| 7,531,784 B2 | 5/2009 | Arao et al. |
| 7,544,528 B2 | 6/2009 | Lee et al. |
| 7,601,984 B2 | 10/2009 | Sano et al. |
| 7,674,650 B2 | 3/2010 | Akimoto et al. |
| 7,696,513 B2 | 4/2010 | Hayashi et al. |
| 7,732,819 B2 | 6/2010 | Akimoto et al. |
| 7,767,505 B2 | 8/2010 | Son et al. |
| 7,791,072 B2 | 9/2010 | Kumomi et al. |
| 7,829,444 B2 | 11/2010 | Yabuta et al. |
| 7,906,780 B2 | 3/2011 | Iwasaki |
| 7,981,734 B2 | 7/2011 | Furuta et al. |
| 7,994,500 B2 | 8/2011 | Kim et al. |
| 7,994,579 B2 | 8/2011 | Itai |
| 8,012,794 B2 | 9/2011 | Ye |
| 8,058,645 B2 | 11/2011 | Jeong et al. |
| 8,101,949 B2 | 1/2012 | Ye |
| 8,125,085 B2 | 2/2012 | Maekawa et al. |
| 8,129,719 B2 | 3/2012 | Yamazaki et al. |
| 8,148,779 B2 | 4/2012 | Jeong et al. |
| 8,178,884 B2 | 5/2012 | Ha et al. |
| 8,178,926 B2 | 5/2012 | Nakayama |
| 8,188,480 B2 | 5/2012 | Itai |
| 8,193,535 B2 | 6/2012 | Ha et al. |
| 8,203,143 B2 | 6/2012 | Imai |
| 8,232,598 B2 | 7/2012 | Yamazaki et al. |
| 8,258,511 B2 | 9/2012 | Ye |
| 8,349,669 B2 | 1/2013 | Ye |
| 8,415,198 B2 | 4/2013 | Itagaki et al. |
| 8,435,843 B2 | 5/2013 | Ye |
| 8,501,555 B2 | 8/2013 | Yamazaki et al. |
| 8,563,977 B2 | 10/2013 | Shimada et al. |
| 8,642,402 B2 | 2/2014 | Yano et al. |
| 8,728,862 B2 | 5/2014 | Ha et al. |
| 8,742,412 B2 | 6/2014 | Goyal et al. |
| 8,785,240 B2 | 7/2014 | Watanabe |
| 8,809,132 B2 | 8/2014 | Ye |
| 9,082,857 B2 | 7/2015 | Yamazaki et al. |
| 9,397,194 B2 | 7/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0102793 A1 | 6/2003 | Komoda et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0070051 A1* | 4/2004 | Sugiyama ......... H01L 21/02381 257/616 |
| 2004/0127038 A1 | 7/2004 | Carcia et al. |
| 2004/0265745 A1 | 12/2004 | Sho et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0256735 A1 | 11/2007 | Yamada et al. |
| 2007/0257248 A1 | 11/2007 | Arao et al. |
| 2007/0272922 A1 | 11/2007 | Kim et al. |
| 2007/0287296 A1 | 12/2007 | Chang |
| 2008/0001232 A1 | 1/2008 | Lee et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |

(56) References Cited

U.S. PATENT DOCUMENTS

| | | |
|---|---|---|
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308806 A1 | 12/2008 | Akimoto et al. |
| 2009/0068773 A1 | 3/2009 | Lai et al. |
| 2009/0072233 A1 | 3/2009 | Hayashi et al. |
| 2009/0073325 A1 | 3/2009 | Kuwabara et al. |
| 2009/0078939 A1 | 3/2009 | Yamazaki et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0174012 A1 | 7/2009 | Iwasaki |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0305468 A1 | 12/2009 | Jung et al. |
| 2009/0321731 A1 | 12/2009 | Jeong et al. |
| 2009/0321732 A1 | 12/2009 | Kim et al. |
| 2010/0006833 A1 | 1/2010 | Ha et al. |
| 2010/0019239 A1 | 1/2010 | Cheong et al. |
| 2010/0035379 A1 | 2/2010 | Miyairi et al. |
| 2010/0038641 A1 | 2/2010 | Imai |
| 2010/0044699 A1 | 2/2010 | Chung et al. |
| 2010/0044864 A1 | 2/2010 | Maekawa et al. |
| 2010/0051936 A1 | 3/2010 | Hayashi et al. |
| 2010/0051937 A1 | 3/2010 | Kaji et al. |
| 2010/0051940 A1 | 3/2010 | Yamazaki et al. |
| 2010/0051949 A1 | 3/2010 | Yamazaki et al. |
| 2010/0059746 A1 | 3/2010 | Itai |
| 2010/0065841 A1 | 3/2010 | Lee et al. |
| 2010/0065844 A1 | 3/2010 | Tokunaga |
| 2010/0081091 A1 | 4/2010 | Hashimoto et al. |
| 2010/0092800 A1 | 4/2010 | Itagaki et al. |
| 2010/0109002 A1 | 5/2010 | Itagaki et al. |
| 2010/0140599 A1 | 6/2010 | Yano et al. |
| 2010/0159639 A1* | 6/2010 | Sakata ............ H01L 21/02565 438/104 |
| 2010/0163863 A1 | 7/2010 | Yaegashi |
| 2010/0241261 A1 | 9/2010 | Taguchi et al. |
| 2010/0267198 A1 | 10/2010 | Yabuta et al. |
| 2010/0295041 A1 | 11/2010 | Kumomi et al. |
| 2010/0295042 A1 | 11/2010 | Yano et al. |
| 2011/0089416 A1 | 4/2011 | Yamazaki et al. |
| 2011/0095288 A1 | 4/2011 | Morosawa et al. |
| 2011/0193083 A1 | 8/2011 | Kim et al. |
| 2011/0215331 A1 | 9/2011 | Yamazaki et al. |
| 2011/0233540 A1 | 9/2011 | Yamazaki |
| 2011/0233541 A1 | 9/2011 | Yamazaki |
| 2011/0233542 A1 | 9/2011 | Yamazaki et al. |
| 2011/0237025 A1 | 9/2011 | Yamazaki |
| 2011/0240990 A1 | 10/2011 | Yamazaki |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0250724 A1 | 10/2011 | Suzawa et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0269266 A1 | 11/2011 | Yamazaki |
| 2011/0281394 A1 | 11/2011 | Yamazaki |
| 2012/0119205 A1 | 5/2012 | Taniguchi et al. |
| 2012/0122277 A1 | 5/2012 | Yamazaki et al. |
| 2012/0132911 A1 | 5/2012 | Shimada et al. |
| 2016/0268437 A1 | 9/2016 | Yamazaki et al. |

FOREIGN PATENT DOCUMENTS

| | | |
|---|---|---|
| CN | 101467257 A | 6/2009 |
| EP | 0449539 A | 10/1991 |
| EP | 1737044 A | 12/2006 |
| EP | 2144294 A | 1/2010 |
| EP | 2159845 A | 3/2010 |
| EP | 2226847 A | 9/2010 |
| GB | 2325344 | 11/1998 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-237456 A | 10/1988 |
| JP | 63-239117 A | 10/1988 |
| JP | 63-265818 A | 11/1988 |
| JP | 03-278466 A | 12/1991 |
| JP | 05-251705 A | 9/1993 |
| JP | 08-264794 A | 10/1996 |
| JP | 10-313114 A | 11/1998 |
| JP | 10-335325 A | 12/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-190822 A | 7/2005 |
| JP | 2006-165527 A | 6/2006 |
| JP | 2006-165528 A | 6/2006 |
| JP | 2006-165531 A | 6/2006 |
| JP | 2006-245333 A | 9/2006 |
| JP | 2007-073558 A | 3/2007 |
| JP | 2007-073561 A | 3/2007 |
| JP | 2007-073563 A | 3/2007 |
| JP | 2007-194594 A | 8/2007 |
| JP | 2007-201366 A | 8/2007 |
| JP | 2007-250984 A | 9/2007 |
| JP | 2008-053356 A | 3/2008 |
| JP | 2008-060419 A | 3/2008 |
| JP | 2008-281988 A | 11/2008 |
| JP | 2009-059805 A | 3/2009 |
| JP | 2009-099944 A | 5/2009 |
| JP | 2009-206508 A | 9/2009 |
| JP | 2009-224737 A | 10/2009 |
| JP | 2009-231613 A | 10/2009 |
| JP | 2010-016163 A | 1/2010 |
| JP | 2010-016347 A | 1/2010 |
| JP | 2010-021170 A | 1/2010 |
| JP | 2010-021520 A | 1/2010 |
| JP | 2010-030824 A | 2/2010 |
| JP | 2010-062229 A | 3/2010 |
| JP | 2010-062276 A | 3/2010 |
| JP | 2010-062549 A | 3/2010 |
| JP | 2010-067954 A | 3/2010 |
| JP | 2010-070409 A | 4/2010 |
| JP | 2010-080947 A | 4/2010 |
| JP | 2010-080952 A | 4/2010 |
| JP | 2010-093240 A | 4/2010 |
| KR | 2008-0098423 A | 11/2008 |
| KR | 2010-0010888 A | 2/2010 |
| KR | 2010-0019381 A | 2/2010 |
| TW | 200828495 | 7/2008 |
| TW | 200941729 | 10/2009 |
| WO | WO-2004/114391 | 12/2004 |
| WO | WO-2007/086291 | 8/2007 |
| WO | WO-2007/119321 | 10/2007 |
| WO | WO-2008/023553 | 2/2008 |
| WO | WO-2008/096768 | 8/2008 |
| WO | WO-2008/123270 | 10/2008 |
| WO | WO-2008/126879 | 10/2008 |
| WO | WO-2008/136505 | 11/2008 |
| WO | WO-2009/034953 | 3/2009 |
| WO | WO-2009/041544 | 4/2009 |

(56) References Cited

FOREIGN PATENT DOCUMENTS

| WO | WO-2009/096608 | 8/2009 |
|---|---|---|
| WO | WO-2010/001783 | 1/2010 |
| WO | WO-2010/002608 | 1/2010 |
| WO | WO-2010/002803 | 1/2010 |
| WO | WO-2010/002807 | 1/2010 |
| WO | WO-2010/029885 | 3/2010 |

OTHER PUBLICATIONS

Written Opinion (Application No. PCT/JP2011/059472) Dated Jul. 19, 2011.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.
Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.
Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.
Ohara.H et al., "21.3:4.0 in. QVGA AMOLED Display Using In—Ga—Zn-Oxide TFTs With a Novel Passivation Layer", SID Digest '09: SID International Symposium Digest of Technical Papers, May 31, 2009, pp. 284-287.

(56) References Cited

OTHER PUBLICATIONS

Godo.H et al., "P-9:Numerical Analysis on Temperature Dependence of Characteristics of In—Ga—Zn-Oxide TFT", SID Digest '09: SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emmison AM-OLED Display", SID Digest '08: SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Kawamura.T et al., "Low-Voltage Operating Amorphous Oxide TFTs", IDW'09 : Proceedings of the 16th International Display Workshops, Dec. 9, 2009, pp. 1689-1692.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Korean Office Action (Application No. 2013-7008895) Dated May 7, 2013.

Taiwanese Office Action (Application No. 106109786) dated Jun. 6, 2017.

\* cited by examiner

MANUFACTURING METHOD OF SEMICONDUCTOR DEVICE

CROSS-REFERENCE TO RELATED APPLICATIONS

This application is a continuation of U.S. application Ser. No. 14/591,043, filed Jan. 7, 2015, now allowed, which is a continuation of U.S. application Ser. No. 13/091,190, filed Apr. 21, 2011, now U.S. Pat. No. 8,945,982, which claims the benefit of a foreign priority application filed in Japan as Serial No. 2010-100316 on Apr. 23, 2010, all of which are incorporated by reference.

TECHNICAL FIELD

The present invention relates to a semiconductor device and a manufacturing method thereof.

In this specification, a semiconductor device generally means any device which can function by utilizing semiconductor characteristics, and an electrooptic device, a semiconductor circuit, and electronic equipment are all semiconductor devices.

BACKGROUND ART

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to the transistor; in addition, an oxide semiconductor has been attracting attention as another material.

For example, a transistor whose active layer includes an amorphous oxide containing indium (In), gallium (Ga), and zinc (Zn) and having an electron carrier concentration of less than $10^{18}/cm^{-3}$ is disclosed (see Patent Document 1).

REFERENCE

Patent Document 1: Japanese Published Patent Application No. 2006-165528

DISCLOSURE OF INVENTION

However, when hydrogen or moisture, which forms an electron donor, is mixed into the oxide semiconductor in a process for manufacturing a device, the electrical conductivity of the oxide semiconductor may change. Such a phenomenon causes variation in the electric characteristics of a transistor using the oxide semiconductor.

In view of such a problem, one object of one embodiment of the present invention is to provide a semiconductor device using an oxide semiconductor, with stable electric characteristics and high reliability.

In a process for manufacturing a transistor including an oxide semiconductor film, dehydration or dehydrogenation is performed by heat treatment and oxygen doping treatment is performed. According to one embodiment of the present invention, oxygen doping treatment is performed at least on a gate insulating film.

One embodiment of the present invention is a method for manufacturing a semiconductor device, in which a gate electrode layer is formed, a gate insulating film is formed over the gate electrode layer, oxygen doping treatment is performed on the gate insulating film to supply an oxygen atom to the gate insulating film, an oxide semiconductor film is formed over the gate insulating film so as to overlap with the gate electrode layer, heat treatment is performed on the oxide semiconductor film to remove a hydrogen atom in the oxide semiconductor film, a source electrode layer and a drain electrode layer which are electrically connected to the oxide semiconductor film are formed, and an insulating film is formed over the oxide semiconductor film, the source electrode layer, and the drain electrode layer so as to be in contact with the oxide semiconductor film.

Note that the above-described "oxygen doping" means that oxygen (which includes at least one of an oxygen radical, an oxygen atom, and an oxygen ion) is added to a bulk. Note that the term "bulk" is used in order to clarify that oxygen is added not only to a top surface of a thin film but also to the inside of the thin film. In addition, "oxygen doping" includes "oxygen plasma doping" in which oxygen in the form of plasma is added to a bulk.

By the oxygen doping treatment in the manufacturing process of the transistor including the oxide semiconductor film, an oxygen-excessive region where the amount of oxygen is greater than the stoichiometric proportion can be provided in at least one of the gate insulating film (bulk thereof), the oxide semiconductor film (bulk thereof), the insulating film (bulk thereof), an interface between the gate insulating film and the oxide semiconductor film, and an interface between the oxide semiconductor film and the insulating film. The amount of oxygen is preferably greater than the stoichiometric proportion and less than four times of the stoichiometric proportion, far preferably greater than the stoichiometric proportion and less than double of the stoichiometric proportion. Such an oxide including excessive oxygen whose amount is greater than the stoichiometric proportion refers to, for example, an oxide which satisfies $2g > 3a+3b+2c+4d+3e+2f$ (g is greater than the sum of $1.5a+1.5b+c+2d+1.5e++f$), where the oxide is represented as $In_aGa_bZn_cSi_dAl_eMg_fO_g$ (a, b, c, d, e, f, g≥0: a, b, c, d, e, f, g is greater than zero). Note that oxygen which is added by the oxygen doping treatment may exist between lattices of the oxide semiconductor.

The above-described oxygen-excessive region may be provided in two or more of the gate insulating film, the oxide semiconductor film, and the insulating film. For example, oxygen-excessive regions can be provided in the interface between the gate insulating film and the oxide semiconductor film, the oxide semiconductor film (bulk thereof), and the interface between the oxide semiconductor film and the insulating film by oxygen doping treatment in the manufacturing process.

Note that while it is acceptable that the amount of oxygen is equal to the stoichiometric proportion in a defect- (oxygen deficiency-)free oxide semiconductor, in order to secure reliability, for example, to suppress variation in the threshold voltage of a transistor, it is preferable that an oxide semiconductor include oxygen whose amount be greater than the stoichiometric proportion. Similarly, while the base film is not necessarily an insulating film containing excessive oxygen in the case of a defect- (oxygen deficiency-)free oxide semiconductor, in order to secure reliability, for example, to suppress variation in the threshold voltage of a transistor, it is preferable that the base film be an insulating film containing excessive oxygen, considering the possibility of occurrence of oxygen deficiency in the oxide semiconductor layer.

With the dehydration or dehydrogenation by the heat treatment subjected to the oxide semiconductor film, a hydrogen atom or an impurity containing a hydrogen atom such as water in the oxide semiconductor film is removed, so that the oxide semiconductor film is highly purified. The amount of oxygen added by the oxygen doping treatment is set to greater than the amount of hydrogen in the highly-purified oxide semiconductor film which has been subjected to the dehydration or dehydrogenation. Excessive oxygen in at least one of the stacked gate insulating film, oxide semiconductor film, and insulating film diffuses and reacts with hydrogen that causes instability, thereby fixing hydrogen (making hydrogen an immovable ion). That is, instability in the reliability can be reduced (or sufficiently decreased). In addition, with excessive oxygen, variation in the threshold voltage Vth due to oxygen deficiency can be reduced and the amount of shift $\Delta$Vth of the threshold voltage can be reduced.

Here, a state in which oxygen is added to the bulk by the above-described "oxygen plasma doping" treatment is described. Note that when oxygen doping treatment is performed on an oxide semiconductor film containing oxygen as one component, it is generally difficult to check an increase or a decrease of the oxygen concentration. Therefore, here, an effect of the oxygen doping treatment was confirmed with a silicon wafer.

Oxygen doping treatment was performed with the use of an inductively coupled plasma (ICP) method. Conditions thereof were as follows: the ICP power is 800 W; the RF bias power 300 W or 0 W; the pressure 1.5 Pa; the oxygen gas flow rate 75 sccm; and the substrate temperature 70° C. FIG. 15 shows an oxygen concentration profile in the depth direction of the silicon wafer according to secondary ion mass spectrometry (SIMS) measurement. In FIG. 15, the vertical axis indicates an oxygen concentration; the horizontal axis indicates a depth from a top surface of the silicon wafer.

It can be confirmed from FIG. 15 that oxygen is added in either of cases where the RF bias power is 0 W or the RF bias power is 300 W. In addition, in the case where the RF bias power is 300 W, oxygen is added more deeply than the case of the RF bias power of 0 W.

Next, FIGS. 16A and 16B show results of observation of a cross section of the silicon wafer before and after the oxygen doping treatment according to scanning transmission electron microscopy (STEM). FIG. 16A is a STEM image of the silicon wafer before the oxygen doping treatment. FIG. 16B is a STEM image of the silicon wafer after the oxygen doping treatment at the RF bias power of 300 W. Referring to FIG. 16B, it can be confirmed that an oxygen-highly-doped region is formed in the silicon wafer by the oxygen doping.

As described above, it is shown that oxygen is added to the silicon wafer by oxygen doping on the silicon wafer. This result leads to an understanding that oxygen can also be added to an oxide semiconductor film by oxygen doping to the oxide semiconductor film.

The effect of the structure which is an embodiment of the invention can be easily understood by considering as below. The description below is just one exemplary consideration.

When a positive voltage is applied to the gate electrode, an electric field is generated from a gate electrode side of the oxide semiconductor film to a back channel side (the opposite side to the gate insulating film), and accordingly, hydrogen ions having positive charge which exist in the oxide semiconductor film are transferred to the back channel side, and accumulated in an oxide semiconductor film side of an interface between the oxide semiconductor film and the insulating film. The positive charge is transferred from the accumulated hydrogen ion to a charge trapping center (such as a hydrogen atom, water, or contamination) in the insulating film, whereby negative charge is accumulated in the back channel side of the oxide semiconductor film. In other words, a parasitic channel is generated on the back channel side of the transistor, and the threshold voltage is shifted to the negative side, so that the transistor tends to be normally-on.

In this manner, the charge trapping center such as hydrogen or water in the insulating film traps the positive charge and is transferred into the insulating film, which varies electric characteristics of the transistor. Therefore, in order to suppress variation of the electrical characteristics of the transistor, it is important that there is no charge trapping center or the number of charge trapping centers is small in the insulating film. Therefore, a sputtering method by which less hydrogen is contained in film deposition is preferably used for formation of the insulating film. In an insulating film deposited by the sputtering method, there is no charge trapping center or the number of which is small, and the transfer of positive charge less occurs as compared to that in the case of using a CVD method or the like. Accordingly, the shift of the threshold voltage of the transistor can be suppressed and the transistor can be normally off.

On the other hand, when a negative voltage is applied to the gate electrode, an electric field is generated from the back channel side to the gate electrode side, and accordingly, hydrogen ions which exist in the oxide semiconductor film are transferred to the gate insulating film side and are accumulated in the oxide semiconductor film side of the interface between the oxide semiconductor film and the gate insulating film. As a result, the threshold voltage of the transistor is shifted to the negative side.

In a state being applied with a voltage of 0, the positive charge is released from the charge trapping center, so that the threshold voltage of the transistor is shifted to the positive side, thereby returning to the initial state, or the threshold voltage is shifted to the positive side beyond the initial state in some cases. These phenomena indicate the existence of easy-to-transfer ions in the oxide semiconductor film. It can be considered that an ion that is transferred most easily is a hydrogen ion that is the smallest atom.

Note that in a bottom-gate transistor, when an oxide semiconductor film is formed over a gate insulating film and then heat treatment is performed thereon, not only water or hydrogen contained in the oxide semiconductor film but also water or hydrogen contained in the gate insulating film can be removed. Thus, in the gate insulating film, the number of charge trapping centers for trapping positive charge which is transferred through the oxide semiconductor film is small. In this manner, the heat treatment for dehydration or dehydrogenation is performed not only on the oxide semiconductor film but also on the gate insulating film below the oxide semiconductor film. Therefore, in the bottom-gate transistor, the gate insulating film may be formed by a CVD method such as a plasma CVD method.

In addition, the oxide semiconductor film absorbs light, whereby a bond of a metal element (M) and a hydrogen atom (H) (the bond also referred to as an M-H bond) in the oxide semiconductor film is cut by optical energy. Note that the optical energy having a wavelength of about 400 nm is equal to or substantially equal to the bond energy of a metal element and a hydrogen atom. When a negative gate bias is applied to a transistor in which the bond of a metal element and a hydrogen atom in the oxide semiconductor film is cut, a hydrogen ion detached from the metal element is attracted to a gate electrode side, so that distribution of electrical charge is changed, the threshold voltage of the transistor is shifted to the negative side, and the transistor tends to be normally on.

Note that the hydrogen ions which have been transferred to the interface with the gate insulating film by light irradiation and application of the negative gate bias to the transistor are returned to the initial state by stopping application of the voltage. This can be regarded as a typical example of the ion transfer in the oxide semiconductor film.

In order to prevent such a change of the electrical characteristics by voltage application (BT deterioration) or a change of the electrical characteristics by light irradiation (light deterioration), it is important to remove a hydrogen atom or an impurity containing a hydrogen atom such as water thoroughly from the oxide semiconductor film to highly purify the oxide semiconductor film. The charge density as small as $10^{15}$ cm$^{-3}$, or the charge per unit area as small as $10^{10}$ cm$^{-2}$ does not affect the transistor characteristics or very slightly affects them. Therefore, it is preferable that the charge density be less than or equal to $10^{15}$ cm$^{-3}$. Assuming that 10% of hydrogen contained in the oxide semiconductor film is transferred within the oxide semiconductor film, it is preferable that the hydrogen concentration be less than or equal to $10^{16}$ cm$^{-3}$. Further, in order to prevent entrance of hydrogen from the outside after a device is completed, it is preferable that a silicon nitride film formed by a sputtering method be used as a passivation film to cover the transistor.

Hydrogen or water can also be removed from the oxide semiconductor film by doping with excessive oxygen as compared to hydrogen contained in the oxide semiconductor film (such that (number of hydrogen atoms)<<(number of oxygen radicals) or (number of oxygen ions)). Specifically, oxygen is made to be plasma by a radio-frequency wave (RF), the bias of the substrate is increased, and an oxygen radical and/or an oxygen ion are/is doped or added into the oxide semiconductor film over the substrate such that the amount of oxygen is greater than that of hydrogen in the oxide semiconductor film. The electronegativity of oxygen is 3.0 which is larger than about 2.0, the electronegativity of a metal (Zn, Ga, In) in the oxide semiconductor film, and thus, excessive oxygen which is excessive as compared to hydrogen is made to be contained to abstract hydrogen from the M-H group of a hydrogen atom, so that an OH group is formed. This OH group may form an M-O—H group with a bond to M.

The oxygen doping is preferably performed such that the amount of oxygen in the oxide semiconductor film is greater than the stoichiometric proportion. For example, in the case where an In—Ga—Zn—O-based oxide semiconductor film is used as the oxide semiconductor film, an ideal single-crystal ratio is 1:1:1:4 (InGaZnO$_4$), and therefore, it is far preferable that the amount of oxygen be made to greater than the stoichiometric proportion and less than double of the stoichiometric proportion by oxygen doping or the like. Accordingly, the amount of oxygen is greater than that of hydrogen in the oxide semiconductor film.

Optical energy or BT stress abstracts hydrogen from the M-H group, which causes deterioration; however, in the case where oxygen is added by the above-described doping, added oxygen is bonded with a hydrogen ion, so that an OH group is formed. The OH group does not discharge a hydrogen ion even by light irradiation or application of BT stress on the transistor because of its high bond energy, and is not easily transferred into the oxide semiconductor film because of its greater mass than the mass of a hydrogen ion. Accordingly, an OH group formed by oxygen doping does not cause deterioration of the transistor or can suppress the deterioration.

In addition, it has been confirmed that as the thickness of the oxide semiconductor film is increased, the variation in the threshold voltage of a transistor tends to increase. It can be guessed that this is because an oxygen defect in the oxide semiconductor film is one cause of the change of the threshold voltage and increases as the thickness of the oxide semiconductor film is increased. A step of doping an oxide semiconductor film with oxygen in a transistor according to one embodiment of the present invention is effective not only for removal of hydrogen or water from the oxide semiconductor film but also for compensation of an oxygen defect in the film. Accordingly, the variation in the threshold voltage can also be controlled in the transistor according to one embodiment of the present invention.

Metal oxide films each formed of a component/components similar to the oxide semiconductor film may be provided with the oxide semiconductor film provided therebetween, which is also effective for prevention of change of the electrical characteristics. As the metal oxide film formed of a component/components similar to the oxide semiconductor film, specifically, a film containing at least one selected from the constituent elements (component elements) of the oxide semiconductor film is preferably used. Such a material can be fit well to the oxide semiconductor film, and therefore, provision of the metal oxide films with the oxide semiconductor film provided therebetween enables an interface between the metal oxide film and the oxide semiconductor film to be kept well. That is, by providing the metal oxide film using the above-described material(s) as an insulating film which is in contact with the oxide semiconductor film, accumulation of hydrogen ions in the interface between the metal oxide film and the oxide semiconductor film and in the vicinity thereof can be suppressed or prevented. Accordingly, as compared to the case where insulating films each formed of a different component/different components from the oxide semiconductor film, such as silicon oxide films are provided with the oxide semiconductor film provided therebetween, the hydrogen concentration in the interface with the oxide semiconductor film, which affects the threshold voltage of the transistor, can be sufficiently decreased.

A gallium oxide film is preferably used as the metal oxide film. Since gallium oxide has a wide bandgap (Eg), by providing gallium oxide films with the oxide semiconductor film provided therebetween, an energy barrier is formed in the interface between the oxide semiconductor film and the metal oxide film to prevent carrier transfer in the interface. Consequently, carriers are not transferred from the oxide semiconductor to the metal oxide, but are transferred within the oxide semiconductor film. On the other hand, a hydrogen ion passes through the interface between the oxide semiconductor and the metal oxide and is accumulated in the vicinity of an interface between the metal oxide and the insulating film. Even when the hydrogen ion is accumulated in the vicinity of the interface with the insulating film, a parasitic channel through which carriers can flow is not formed in the metal oxide film such as a gallium oxide film, which results in no effect or a very slight effect on the threshold voltage of the transistor. The energy barrier in the case where gallium oxide is in contact with a In—Ga—Zn—O-based material is about 0.8 eV on the conduction band side and is about 0.9 eV on the valence band side.

One technological idea of a transistor according to one embodiment of the present invention is to increase the amount of oxygen contained in at least one of a gate insulating film in contact with an oxide semiconductor film, the oxide semiconductor film, and the vicinity of an interface between them by oxygen doping treatment.

In the case where an oxide semiconductor material which contains indium whose bonding strength to oxygen is relatively weak is used for the oxide semiconductor film, when the insulating film in contact with the oxide semiconductor film contains a material which has a stronger bonding strength to oxygen, such as silicon, oxygen in the oxide semiconductor film may be deprived by heat treatment, which may cause formation of oxygen deficiency in the vicinity of the interface with the oxide semiconductor film. However, in a transistor according to one embodiment of the present invention, the formation of oxygen deficiency can be suppressed by supplying excessive oxygen to the oxide semiconductor film.

Here, after the oxygen doping treatment is performed in the manufacturing process of a transistor, the amount of oxygen which is greater than the stoichimetric proportion, contained in the oxide semiconductor film or the gate insulating film in contact with the oxide semiconductor film may be different between layers. It can be considered that chemical potential of oxygen is different between the layers where the amount of excessive oxygen is different between them, and the difference in the chemical potential comes to equilibrium or substantial equilibrium by heat treatment or the like in the manufacturing process of the transistor. Therefore, it is more preferable that heat treatment be performed after the oxygen doping treatment on the gate insulating film. With the heat treatment after the oxygen doping treatment, oxygen supplied excessively to the gate insulating film can be diffused to supply a sufficient amount of oxygen to the oxide semiconductor film. Distribution of oxygen in the equilibrium state is considered below.

The equilibrium state at a temperature T at a pressure P refers to the state in which a Gibbs free energy of the whole of the systems, G is the minimum, which is represented by the following formula (1).

[Formula 1]

$$G(N_a, N_b, N_c, \ldots, T, P) = G^{(1)}(N_a, N_b, N_c, \ldots, T, P) + G^{(2)}(N_a, N_b, N_c, \ldots, T, P) + G^{(3)}(N_a, N_b, N_c, \ldots, T, P) \quad (1)$$

In the formula (1), reference symbols $G^{(1)}$, $G^{(2)}$, and $G^{(3)}$ denote Gibbs free energies of layers. Reference symbols $N_a$, $N_b$, and $N_c$ denote respective numbers of particles, and reference symbols a, b, and c denote respective particle kinds. The Gibbs free energy changes as represented by the following formula (2) when the particle a is transferred from an i layer to a j layer by $\delta N_a^{(j)}$.

[FORMULA 2]

$$\delta G = -\frac{\partial G^{(i)}}{\partial N_a^{(i)}} \delta N_a^{(j)} + \frac{\partial G^{(j)}}{\partial N_a^{(j)}} \delta N_a^{(j)} \quad (2)$$

When $\delta G$ is 0 in the formula (2), or when the following formula (3) is satisfied, the systems are in the equilibrium state.

[FORMULA 3]

$$\frac{\partial G^{(i)}}{\partial N_a^{(i)}} = \frac{\partial G^{(j)}}{\partial N_a^{(j)}} \quad (3)$$

The differential of the Gibbs free energy with respect to the number of particles corresponds to the chemical potential, and thus the chemical potentials of particles are uniform in the layers in the equilibrium state.

In other words, specifically, when the amount of oxygen contained in the gate insulating film which is in contact with the oxide semiconductor film is excessive as compared to the oxide semiconductor film, the chemical potential of oxygen is relatively small in the oxide semiconductor film and is relatively large in the gate insulating film.

Then, when the temperature of the whole of the systems (e.g., the oxide semiconductor film and the gate insulating film in contact with the oxide semiconductor film, here) becomes high enough to cause atom diffusion in the layer(s) and between the layers by heat treatment in the manufacturing process of the transistor, oxygen is transferred so as to make the chemical potentials uniform. That is, oxygen in the gate insulating film is transferred to the oxide semiconductor film, whereby the chemical potential of the gate insulating film is decreased and the chemical potential of the oxide semiconductor film is increased.

In this manner, oxygen supplied excessively to the gate insulating film by the oxygen doping treatment is diffused to be supplied to the oxide semiconductor film by the following heat treatment to make the chemical potential of the systems to be in the equilibrium state. As described above, oxygen supplied to the oxide semiconductor film is bonded to a hydrogen ion to form an OH group, which does not cause deterioration of the transistor or can suppress the deterioration. The supply of oxygen to an oxide semiconductor film is also effective for compensation of an oxygen defect in the film.

A transistor including an oxide semiconductor film subjected to dehydration or dehydrogenation by heat treatment and oxygen doping treatment is a transistor having high reliability in which the amount of change in threshold voltage of the transistor by the bias-temperature stress (BT) test can be reduced.

Accordingly, a transistor having stable electric characteristics can be manufactured.

According to one embodiment of the present invention, a semiconductor device having a transistor with high electric characteristics and reliability can be manufactured.

BEST MODE FOR CARRYING OUT THE INVENTION

Hereinafter, embodiments of the present invention will be described in detail with reference to the accompanying drawings. The present invention is not limited to the following description, and it is easily understood by those skilled in the art that modes and details of the present invention can be modified in various ways without departing from the purpose and scope of the present invention. Accordingly, the present invention is not construed as being limited to the description of the embodiments and example included herein. The ordinal numbers such as "first" and "second" in this specification are used for convenience and do not denote the order of steps or the stacking order of layers. In addition, the ordinal numbers in this specification do not denote particular names which specify the present invention.

(Embodiment 1)

In Embodiment 1, one embodiment of a semiconductor device and one embodiment of a method for manufacturing the semiconductor device will be described using FIGS. 1A to 1C, FIGS. 2A to 2E, and FIGS. 3A to 3D. In this embodiment, a transistor including an oxide semiconductor film is described as an example of the semiconductor device.

Figure 1A:
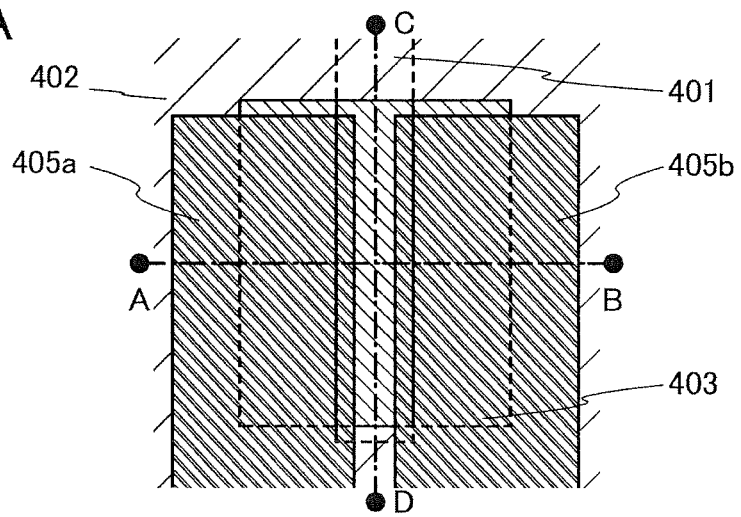
FIGS. 1A to 1C illustrate one embodiment of a semiconductor device.
Figure 1B:
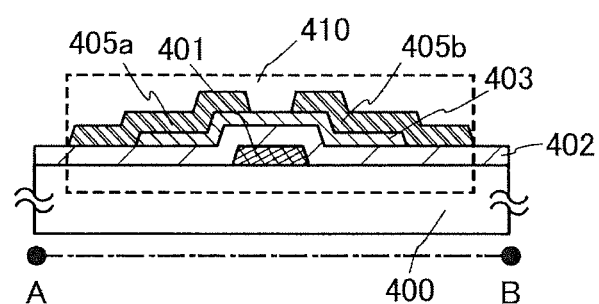
Figure 1C:
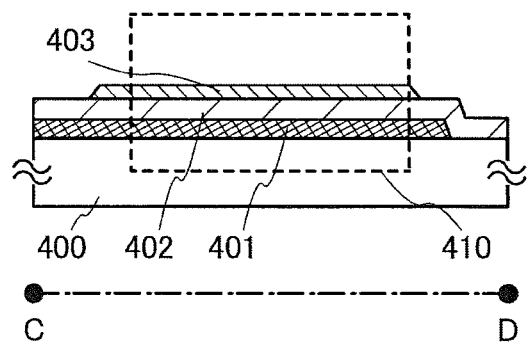

FIGS. 1A to 1C are a plan view and cross-sectional views of a bottom-gate transistor described as an example of a semiconductor device. FIG. 1A is the plan view; FIGS. 1B and 1C are the cross-sectional views along line A-B and line C-D in FIG. 1A, respectively. A gate insulating film 402 is omitted in FIG. 1A.

A transistor 410 shown in FIGS. 1A to 1C includes, over a substrate 400 having an insulating surface, a gate electrode layer 401, the gate insulating film 402, an oxide semiconductor film 403, a source electrode layer 405a, and a drain electrode layer 405b.

In a process for manufacturing the transistor 410, oxygen doping treatment is performed on the gate insulating film 402 and heat treatment for dehydration or dehydrogenation is performed on the oxide semiconductor film 403.

The oxygen doping treatment is addition of an oxygen radical or an oxygen atom or an oxygen ion to a top surface and the bulk of the gate insulating film. In particular, addition of an oxygen radical or an oxygen atom or an oxygen ion to the top surface and the bulk of the gate insulating film, with oxygen plasma is also called oxygen plasma doping treatment. The substrate over which the gate insulating film is formed is preferably biased while the oxygen plasma doping treatment.

An insulator may be provided over the transistor 410. In order to electrically connect the source electrode layer 405a or the drain electrode layer 405b to a wiring, an opening may be formed in the gate insulating film 402 or the like. A second gate electrode may be provided above the oxide semiconductor film 403. The oxide semiconductor film 403 is preferably processed into an island shape but is not necessarily processed into the shape.

FIGS. 2A to 2E illustrate an example of a method for manufacturing the transistor 410.

First, a conductive film is formed over the substrate 400 having an insulating surface, and then, subjected to a first photolithography step, so that the gate electrode layer 401 is formed. Note that a resist mask may be formed by an inkjet method. Formation of the resist mask by an inkjet method needs no photomask; thus, manufacturing cost can be reduced.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, carbon silicon, or the like; a compound semiconductor substrate of silicon germanium or the like; an SOI substrate; or the like can be used as the substrate 400, or the substrate provided with a semiconductor element can be used as the substrate 400.

Further, a flexible substrate may be used as the substrate 400. In the case where a flexible substrate is used, a transistor including an oxide semiconductor film may be directly formed over the flexible substrate, or alternatively, a transistor including an oxide semiconductor film may be formed over another substrate and separated from another substrate to be transferred to the flexible substrate. In order to separate the transistor from another substrate and transfer the transistor to the flexible substrate, a separation layer may be provided between the substrate and the transistor including the oxide semiconductor film.

An insulating film serving as a base film may be provided between the substrate 400 and the gate electrode layer 401. The base film prevents diffusion of an impurity element from the substrate 400, and can be formed with a single-layer structure or a multi-layer structure using one or more of a silicon nitride film, a silicon oxide film, a silicon nitride oxide film, and a silicon oxynitride film.

The gate electrode layer 401 can be formed with a single-layer structure or a multi-layer structure using a metal material such as molybdenum, titanium, tantalum, tungsten, aluminum, copper, neodymium, or scandium, and/or an alloy material which contains any of these materials as a main component by a plasma CVD method, a sputtering method, or the like.

Figure 2A:
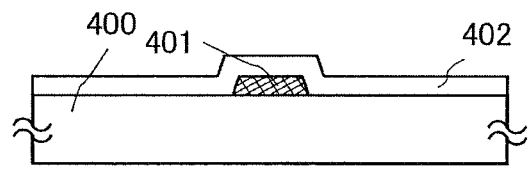
FIGS. 2A to 2E illustrate one embodiment of a method for manufacturing a semiconductor device.
Figure 2B:
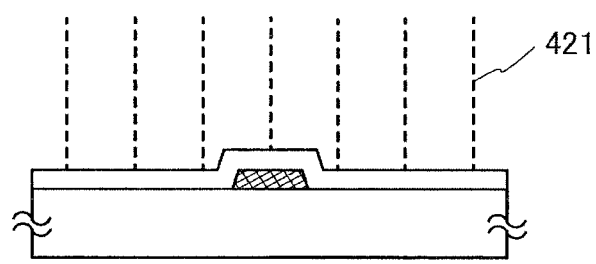

Next, the gate insulating film 402 is formed over the gate electrode layer 401 (see FIG. 2A). The gate insulating film 402 can be formed with a single-layer structure or a multi-layer structure using silicon oxide, silicon nitride, silicon oxynitride, silicon nitride oxide, aluminum oxide, aluminum nitride, aluminum oxynitride, aluminum nitride oxide, hafnium oxide, and/or gallium oxide, and/or a combination thereof by a plasma CVD method, a sputtering method, or the like.

It is far preferable that an insulating material containing a component/components similar to the oxide semiconductor film formed later be used for the gate insulating film 402.

This is because such a material can be fit well to the oxide semiconductor film, and therefore, this use for the gate insulating film 402 enables a state of an interface between the gate insulating film 402 and the oxide semiconductor film to be kept well. To contain the component(s) similar to the oxide semiconductor film means to contain at least one selected from a constituent element or constituent elements of the oxide semiconductor film. For example, in the case where the oxide semiconductor film is formed using an In—Ga—Zn-based oxide semiconductor material, gallium oxide can be given as an example of the insulating material containing the component(s) similar to the oxide semiconductor film.

As a far preferable example of a multi-layer structure for the gate insulating film 402, a multi-layer structure of a film (hereinafter referred to as a film a) containing the insulating material containing the component(s) similar to the oxide semiconductor film and a film (hereinafter referred to as a film b) containing a material/materials different from the component material(s) of the film a can be given. This is because with a structure in which the film a and the film b are stacked with the oxide semiconductor film side in order, electrical charge is preferentially trapped by a charge trapping center in an interface between the films a and b (as compared to an interface between the oxide semiconductor film and the film a), so that charge trapping in the interface with the oxide semiconductor film can be sufficiently suppressed, leading to improvement in the reliability of a semiconductor device.

Figure 3A:
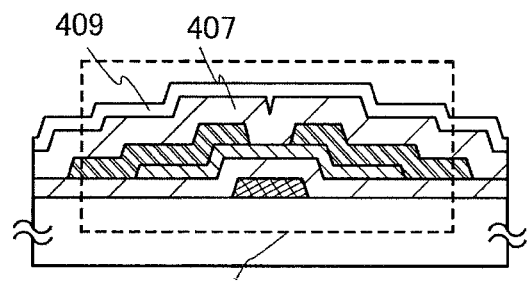
FIGS. 3A to 3D illustrate embodiments of a semiconductor device.
Figure 3B:
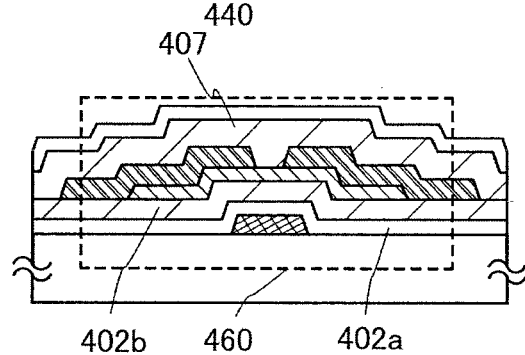

A transistor 460 in which a gate insulating film has a multi-layer structure is shown in FIG. 3B. In the transistor 460, a first gate insulating film 402a and a second gate insulating film 402b are stacked on the gate electrode layer 401, and the oxide semiconductor film 403 is formed over the second gate insulating film 402b. In the transistor 460, the second gate insulating film 402b which is in contact with the oxide semiconductor film 403 is the film (film a) containing the insulating material containing the component(s) similar to the oxide semiconductor film 403, the first gate insulating film 402a below the second gate insulating film 402b is the film (film b) containing a material/materials different from the component material(s) of the second gate insulating film 402b.

For example, in the case where an In—Ga—Zn-based oxide semiconductor film is used as the oxide semiconductor film 403, a gallium oxide film can be used as the second gate insulating film 402b and a silicon oxide film can be used as the first gate insulating film 402a. Further, it is preferable that a film containing an insulating material containing a component/components similar to the oxide semiconductor film be used as an insulating film 407 on and in contact with the oxide semiconductor film 403. With the films containing the insulating materials containing the components similar to the oxide semiconductor film, which are provided above and below and in contact with the oxide semiconductor film 403, the oxide semiconductor film 403 can be surrounded. With a structure in which the films (films a) containing the insulating materials containing the components similar to the oxide semiconductor film are provided above and below and in contact with the oxide semiconductor film 403 and the film (film b) containing the material/materials different from the component material(s) of the films a is provided outside of the films a, electrical charge can be preferentially trapped by a charge trapping center in an interface between the film a and the film b above and/or below the oxide semiconductor film 403, so that charge trapping in an interface with the oxide semiconductor film can be sufficiently suppressed more effectively, leading to improvement in the reliability of a semiconductor device.

For the method for manufacturing the gate insulating film 402, a high-density plasma CVD method using microwaves (e.g., with a frequency of 2.45 GHz) is preferably employed because an insulating layer which is dense and can have high breakdown voltage and high quality. This is because when the highly purified oxide semiconductor is closely in contact with the high-quality gate insulating film, the interface state density can be reduced and interface properties can be favorable.

Further, an insulating layer may be formed, whose film quality and interface characteristics with the oxide semiconductor are improved by heat treatment which is performed after film formation. In either case, any film can be used as long as film quality as a gate insulating film is high, interface state density with an oxide semiconductor is decreased, and a favorable interface can be formed.

Next, oxygen doping treatment is performed on the gate insulating film 402. By the oxygen doping treatment on the gate insulating film 402, oxygen 421 is supplied to the gate insulating film 402, so that oxygen is contained in the gate insulating film 402 and/or the vicinity of the interface (see FIG. 2B). In that case, the amount of oxygen contained is made to greater than the stoichiometric proportion of the gate insulating film 402, preferably to greater than the stoichiometric proportion and less than four times as much as that of the stoichiometric proportion thereof, far preferably to greater than the stoichiometric proportion and less than double of the stoichiometric proportion thereof. It can be alternatively said that the amount of oxygen contained is made to greater than Y, where the amount of oxygen contained in a material of the gate insulating film in the case where the material is a single crystal is denoted by Y, preferably to greater than Y and less than 4 Y, far preferably to greater than Y and less than 2Y. It can be further alternatively said that the amount of oxygen contained is made to greater than Z, where the amount of oxygen contained in a gate insulating film which is subjected to no oxygen doping treatment is denoted by Z, preferably to greater than Z and less than 4Z, far preferably to greater than Z and less than 2Z. The oxygen 421 for doping contains an oxygen radical, an oxygen atom, and/or an oxygen ion.

For example, in the case of using an oxide insulating film the composition of which is represented by $GaO_x$ (x>0), since the stoichiometric proportion of gallium oxide is Ga:O=1:1.5, an oxide insulating film including an oxygen-excessive region where x is greater than 1.5 and less than 6 is formed. For example, in the case of using an oxide insulating film the composition of which is represented by $SiO_x$ (x>0), since the stoichiometric proportion of silicon oxide is Si:O=1:2, an oxide insulating film including an oxygen-excessive region where x is greater than 2 and less than 8 is formed. Such an oxygen-excessive region may exist in a part of the gate insulating film (including its interface). In this manner, the amount of oxygen is made to greater than that of hydrogen in the gate insulating film.

In the oxide insulating film which can be used as the gate insulating film, oxygen is one of main component materials. Therefore, it is difficult to estimate the oxygen concentration of the oxide insulating film accurately with Secondary Ion Mass Spectroscopy (SIMS) or the like. That is, it is difficult to judge whether oxygen is intentionally added to the oxide insulating film or not.

Isotopes such as $^{17}O$ or $^{18}O$ exist in oxygen, and it is know that the existence proportions of them in nature are about 0.037% and about 0.204% of the whole oxygen atoms. Therefore, the concentration of such an isotope in the oxide insulating film can be estimated by SIMS or the like, and the measurement of such a concentration enables the oxygen concentration in the oxide insulating film to be estimated accurately. Thus, by measuring the concentration, whether oxygen is intentionally added to the oxide insulating film or not may be judged.

For example, with respect to the concentration of $^{18}O$, a concentration of the isotope of oxygen $D1(^{18}O)$ in an oxygen-added region and a concentration of the isotope of oxygen $D2(^{18}O)$ in a no-oxygen-added region have a relationship represented by $D1(^{18}O) > D2(^{18}O)$.

Oxygen for the doping may be supplied from a radical generating apparatus with use of a gas including oxygen or from an ozone generating apparatus. More specifically, for example, the oxygen 421 can be generated with an apparatus for etching treatment on a semiconductor device, an apparatus for ashing on a mask, or the like to process the gate insulating film 402.

In addition, heat treatment (at 150° C. to 470° C.) may be performed on the gate insulating film 402 which has been subjected to the oxygen doping treatment. By the heat treatment, water or hydroxide generated by reaction between the oxygen 421 and the gate insulating film 402 can be removed from the gate insulating film 402. The heat treatment may be performed under an atmosphere of nitrogen, oxygen, an ultra dry air (the moisture amount is less than or equal to 20 ppm (−55° C. by conversion into a dew point), preferably less than or equal to 1 ppm, far preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas is preferably highly purified without containing water, hydrogen, or the like.

In order that hydrogen, a hydroxyl group, and moisture are contained as little as possible in the gate insulating film 402 and the oxide semiconductor film provided over the gate insulating film 402, it is preferable that the substrate 400 over which the gate electrode layer 401 is formed or the substrate 400 which has been subjected to the manufacturing process up to and including the step for forming the gate insulating film 402 be preheated in a preheating chamber of a sputtering apparatus as pretreatment for the formation of the oxide semiconductor film, so that impurities such as hydrogen and moisture adsorbed to the substrate 400 are eliminated and removed. As an exhaustion unit provided in the preheating chamber, a cryopump is preferable. This preheating treatment is not necessarily performed. Further, this preheating may be performed on the substrate 400 which has been subjected to the manufacturing process up to and including the step for forming the source electrode layer 405a and the drain electrode layer 405b, before the formation of the insulating film 407.

Next, over the gate insulating film 402, an oxide semiconductor film with a thickness of greater than or equal to 2 nm and less than or equal to 200 nm, preferably greater than or equal to 5 nm and less than or equal to 30 nm is fondled.

As an oxide semiconductor used for the oxide semiconductor film, any of the following oxide semiconductors can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a an In—O-based oxide semiconductor; a Sn—O-based oxide semiconductor; a Zn—O-based oxide semiconductor; and the like. Further, $SiO_2$ may be contained in the above oxide semiconductor. Note that here, for example, the In—Ga—Zn—O-based oxide semiconductor means an oxide film containing indium (In), gallium (Ga), and zinc (Zn) and there is no particular limitation on the stoichiometric proportion. The In—Ga—Zn—O-based oxide semiconductor may contain an element other than In, Ga, and Zn.

As the oxide semiconductor film, a thin film of a material represented by the chemical formula, $InMO_3(ZnO)_m$ (m>0), can be used. Here, M represents one or more metal elements selected from Ga, Al, Mn, and Co. For example, M may be Ga, Ga and Al, Ga and Mn, Ga and Co, or the like.

For the oxide semiconductor film, an oxide semiconductor containing indium, an oxide semiconductor containing indium and gallium, or the like can be preferably used.

In this embodiment, the oxide semiconductor film is formed by a sputtering method using an In—Ga—Zn—O-based oxide semiconductor target. The oxide semiconductor film can be formed by a sputtering method in a rare gas (typically, argon) atmosphere, an oxygen atmosphere, or a mixed atmosphere of a rare gas and oxygen.

A target used for formation of the oxide semiconductor film by a sputtering method is, for example, an oxide target containing $In_2O_3$, $Ga_2O_3$, and ZnO at a composition ratio of 1:1:1 [molar ratio], so that an In—Ga—Zn—O film is formed. Without limitation on the material and the composition of the target, for example, an oxide target having a composition ratio of $In_2O_3:Ga_2O_3:ZnO=1:1:2$ [molar ratio] may be used.

Furthermore, the filling rate of the oxide target is 90% to 100%, preferably 95% to 99.9%. With use of the metal oxide target with such a high filling rate, a dense oxide semiconductor film can be formed.

It is preferable that a high-purity gas with an impurity such as hydrogen, water, hydroxyl, or hydride removed be used as a sputtering gas for forming the oxide semiconductor film.

The substrate is held in a deposition chamber kept under reduced pressure, and the substrate temperature is set to temperatures higher than or equal to 100° C. and lower than or equal to 600° C., preferably higher than or equal to 200° C. and lower than or equal to 400° C. By forming the oxide semiconductor film while heating the substrate, the concentration of the impurity included in the oxide semiconductor film can be reduced. In addition, damage by sputtering can be suppressed. Then, residual moisture in the deposition chamber is removed, a sputtering gas from which hydrogen and moisture are removed is introduced, and the above-described target is used, so that the oxide semiconductor film is formed over the substrate 400. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water, (more preferably, also a compound containing a carbon atom), and the like are removed, whereby the concentration of an impurity in the oxide semiconductor film formed in the deposition chamber can be reduced.

As one example of the film formation condition, the following is employed: the distance between the substrate and the target is 100 mm, the pressure is 0.6 Pa, the direct-current (DC) power is 0.5 kW, and the atmosphere is an oxygen atmosphere (the proportion of the oxygen flow rate is 100%). A pulsed direct-current power source is preferably used since powder substances (also referred to as particles or dust) that are generated in deposition can be reduced and the film thickness comes to be uniform.

Figure 2C:
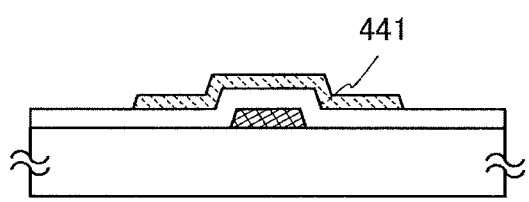
Figure 2D:
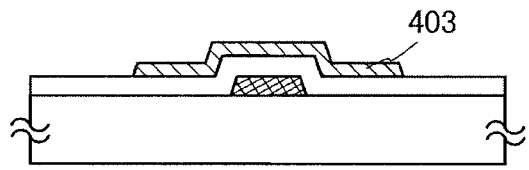

Next, the oxide semiconductor film is processed into an island-shaped oxide semiconductor film 441 by a second photolithography step (see FIG. 2C). A resist mask used for forming the island-shaped oxide semiconductor film 441 may be formed by an inkjet method. Formation of the resist mask by an inkjet method needs no photomask; thus, manufacturing cost can be reduced.

In the case where a contact hole is formed in the gate insulating film 402, a step of forming the contact hole can be performed at the same time as processing of the oxide semiconductor film.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. As the etchant, ITO07N (produced by KANTO CHEMICAL CO., INC.) may be used as well.

Next, the oxide semiconductor film 441 is subjected to heat treatment. With this heat treatment, excessive hydrogen (including water and a hydroxyl group) can be removed (dehydration or dehydrogenation), the structure of the oxide semiconductor film can be improved, and defect levels in an energy gap can be reduced. The temperature of the heat treatment is higher than or equal to 250° C. and lower than or equal to 750° C., or higher than or equal to 400° C. and less than the strain point of the substrate. In this embodiment, the substrate is put in an electric furnace which is a kind of heat treatment apparatus and the oxide semiconductor film is subjected to heat treatment at 450° C. for one hour in a nitrogen atmosphere, and then, water and hydrogen are prevented from being mixed into the oxide semiconductor film by preventing the substrate from being exposed to the air; thus, the oxide semiconductor film 403 is obtained (see FIG. 2D).

Note that the heat treatment apparatus is not limited to the electric furnace, and an apparatus for heating an object by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, an inert gas which does not react with an object by heat treatment, such as nitrogen or a rare gas like argon, is used.

For example, as the heat treatment, GRTA may be performed, in which the substrate is moved into an inert gas heated at a high temperature of 650° C. to 700° C., and heated for several minutes, and then the substrate is moved out of the inert gas.

In the heat treatment, it is preferable that an impurity such as water, hydrogen, and the like be not contained in nitrogen or the rare gas such as helium, neon, or argon. The purity of nitrogen or the rare gas such as helium, neon, or argon which is introduced into the heat treatment apparatus is set to preferably 6N (99.9999%) or higher, far preferably 7N (99.99999%) or higher (that is, the impurity concentration is preferably 1 ppm or lower, far preferably 0.1 ppm or lower).

In addition, after the oxide semiconductor film is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, far preferably less than or equal to 10 ppb, in the measurement with the use of a dew point meter of a cavity ring down laser spectroscopy (CRDS) system) may be introduced into the same furnace. It is preferable that water, hydrogen, or the like be not contained in the oxygen gas or the $N_2O$ gas. The purity of the oxygen gas or the $N_2O$ gas which is introduced into the heat treatment apparatus is preferably 6N or more, far preferably 7N or more (i.e., the impurity concentration in the oxygen gas or the $N_2O$ gas is preferably 1 ppm or lower, far preferably 0.1 ppm or lower). The oxygen gas or the $N_2O$ gas acts to supply oxygen that is a main component of the oxide semiconductor and that is reduced by the step for removing an impurity for the dehydration or dehydrogenation, so that the oxide semiconductor film can be a high-purified, electrically i-type (intrinsic) oxide semiconductor film.

The heat treatment can also be performed on the oxide semiconductor film before the oxide semiconductor film is processed into the island-shaped oxide semiconductor film. In that case, after the heat treatment, the substrate is taken out of the heating apparatus and a photolithography step is performed on the oxide semiconductor film. The heat treatment may be performed after a source electrode layer and a drain electrode layer are formed over the island-shaped oxide semiconductor film as long as the oxide semiconductor film is formed before that heat treatment.

Since the amount of oxygen contained in the gate insulating film 402 is excessive because of the oxygen doping treatment performed on the gate insulating film 402, oxygen transfer from the oxide semiconductor film 403 stacked on and in contact with the gate insulating film 402 can be suppressed. Further, since the oxide semiconductor film 403 is stacked on and in contact with the gate insulating film 402 subjected to the oxygen doping treatment, oxygen can be supplied from the gate insulating film 402 (bulk thereof and/or interface thereof) to the oxide semiconductor film 403. The oxygen supply from the gate insulating film 402 to the oxide semiconductor film 403 is further promoted by heat treatment on a state where the gate insulating film 402 subjected to the oxygen doping treatment is in contact with the oxide semiconductor film 403. That heat treatment can also serve as heat treatment for dehydration or dehydrogenation.

The oxygen 421 added to the gate insulating film 402 and supplied to the oxide semiconductor film 403 preferably has at least partly a dangling bond of oxygen in the oxide semiconductor. This is because the dangling bond can be bonded with hydrogen left in the film to immobilize hydrogen (make hydrogen an immovable ion).

Through the above steps, the oxide semiconductor film 403 is highly purified and is made electrically i-type (intrinsic).

Next, a conductive film for forming a source electrode layer and a drain electrode layer (including a wiring formed of the same layer as the source electrode layer and the drain electrode layer) is formed over the gate insulating film 402 and the oxide semiconductor film 403. As the conductive film serving as the source electrode layer and the drain electrode layer, for example, a metal film including an element selected from Al, Cr, Cu, Ta, Ti, Mo, and W, or a metal nitride film including any of the above elements as its component (e.g., a titanium nitride film, a molybdenum nitride film, or a tungsten nitride film) can be used. A film of a high-melting-point metal such as Ti, Mo, or W or a metal nitride film thereof (e.g., a titanium nitride film, a molybdenum nitride film, or a tungsten nitride film) may be provided over or/and below the metal film such as an Al film or a Cu film to form the conductive film serving as the source electrode layer and the drain electrode layer. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide mixed oxide ($In_2O_3$—$SnO_2$; abbreviated to ITO), indium oxide-zinc oxide mixed oxide ($In_2O_3$—ZnO), or any of these metal oxide materials in which silicon or silicon oxide is contained can be used.

A resist mask is formed over the conductive film by a third photolithography step, and is selectively etched, so that the source electrode layer 405a and the drain electrode layer 405b are formed. Then, the resist mask is removed.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed with one multi-tone mask. Thus, the number of photomasks can be reduced and the number of photolithography steps can be also reduced accordingly, whereby simplification of a manufacturing process can be realized.

It is preferable that etching conditions be optimized so as not to etch and cut the oxide semiconductor film 403 when the conductive film is etched. However, it is difficult to obtain etching conditions in which only the conductive film is etched and the oxide semiconductor film 403 is not etched at all. In some cases, part of the oxide semiconductor film 441 is etched off through the etching of the conductive film, so that an oxide semiconductor film having a groove portion (a depressed portion) is formed.

In this embodiment, a Ti film is used as the conductive film and an In—Ga—Zn—O-based oxide semiconductor is used as the oxide semiconductor film 403, and therefore, ammonium hydrogen peroxide (a mixture of ammonia, water, and hydrogen peroxide) is used as an etchant.

The number of carriers in the highly purified oxide semiconductor film 403 is significantly small (close to zero).

Figure 2E:
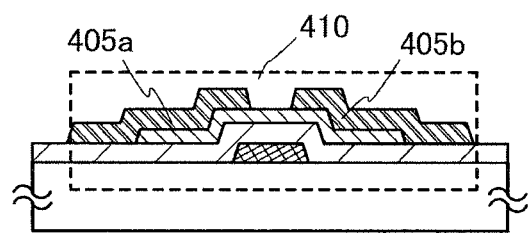

Through the above process, the transistor 410 is formed (see FIG. 2E). The transistor 410 is a transistor including the oxide semiconductor film 403 which is highly purified and from which an impurity such as hydrogen, moisture, a hydroxyl group, or hydride (also referred to as a hydrogen compound) is removed. Therefore, variation in the electric characteristics of the transistor 410 is suppressed and the transistor 410 is electrically stable.

Further, as shown in FIG. 3A, a transistor 440 in which an insulating film 407 and an insulating film 409 are provided over the oxide semiconductor film 403 and the source electrode layer 405a and the drain electrode layer 405b can be formed.

The insulating film 407 can be formed to a thickness of at least 1 nm by a method by which an impurity such as water and hydrogen does not enter the insulating film 407, such as a sputtering method, as appropriate. When hydrogen is contained in the insulating film 407, entry of hydrogen into the oxide semiconductor film or extraction of oxygen from the oxide semiconductor film by hydrogen is caused; thus, the resistance of a back channel of the oxide semiconductor film might become low (the conductivity of the same might be n-type) and a parasitic channel might be formed. Therefore, it is important that a film formation method in which hydrogen is not used is employed in order to form the insulating film 407 containing as little hydrogen as possible.

As the insulating film 407, an inorganic insulating film such as a silicon oxide film, a silicon oxynitride film, an aluminum oxide film, an aluminum oxynitride film, or a gallium oxide film can be typically used.

In this embodiment, a 200-nm-thick gallium oxide film is deposited as the insulating film 407 by a sputtering method.

It is far preferable that an insulating material containing a component/components similar to the oxide semiconductor film 403 be used for the insulating film 407, like the gate insulating film 402. This is because such a material can be fit well to the oxide semiconductor film, and therefore, this use for the insulating film 407 enables a state of an interface between the insulating film and the oxide semiconductor film to be kept well. For example, in the case where the oxide semiconductor film is formed using an In—Ga—Zn—O-based oxide semiconductor material, gallium oxide can be given as an example of the insulating material containing the component(s) similar to the oxide semiconductor film 403.

As a far preferable example of a multi-layer structure for the insulating film 407, a multi-layer structure of a film (hereinafter referred to as a film a) containing the insulating material containing the component(s) similar to the oxide semiconductor film and a film (hereinafter referred to as a film b) containing a material/materials different from the component material(s) of the film a can be given. This is because with a structure in which the film a and the film b are stacked on the oxide semiconductor film side in order, electrical charge is preferentially trapped by a charge trapping center in an interface between the films a and b (as compared to an interface between the oxide semiconductor film and the film a), so that charge trapping in the interface with the oxide semiconductor film can be sufficiently suppressed, leading to improvement in the reliability of a semiconductor device.

For example, a multi-layer in which a gallium oxide film and a silicon oxide film are stacked on the oxide semiconductor film 403 side, or a multi-layer in which a gallium oxide film and a silicon nitride film are stacked on the oxide semiconductor film 403 side can be preferably used as the insulating film 407.

The substrate temperature at the time of the formation of the silicon oxide film may be higher than or equal to room temperature and lower than or equal to 300° C.; in this embodiment, the substrate temperature is 100° C. as an example. The silicon oxide film can be formed by a sputtering method in a rare gas (typically, argon) atmosphere, an oxygen atmosphere, or a mixed atmosphere of a rare gas and oxygen. As a target, a silicon oxide target or a silicon target can be used. For example, the silicon oxide film can be formed using a silicon target by a sputtering method in an atmosphere containing oxygen.

In order to remove residual moisture from the deposition chamber of the insulating film 407 in a manner similar to that of the formation of the oxide semiconductor film, an entrapment vacuum pump (such as a cryopump) is preferably used. When the insulating film 407 is deposited in the deposition chamber evacuated using a cryopump, the impurity concentration of the insulating film 407 can be reduced. As an evacuation unit for removing moisture remaining in the deposition chamber of the insulating film 407, a turbo molecular pump provided with a cold trap may be used.

It is preferable that a high-purity gas from which an impurity such as hydrogen, water, hydroxyl group, or hydride be removed be used as a sputtering gas used for formation of the insulating film 407.

It is preferable to perform heat treatment after the formation of the insulating film 407. The heat treatment is performed at a temperature higher than or equal to 250° C. and lower than or equal to 700° C., preferably higher than or equal to 450° C. and lower than or equal to 600° C. or less than a strain point of the substrate.

The heat treatment may be performed under an atmosphere of nitrogen, oxygen, an ultra dry air (the moisture amount is less than or equal to 20 ppm (−55° C. by conversion into a dew point), preferably less than or equal to 1 ppm, far preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas preferably contains water, hydrogen, or the like as less as possible. The purity of nitrogen, oxygen, or the rare gas which is introduced into the heat treatment apparatus is set to preferably 6N (99.9999%) or higher, far preferably 7N (99.99999%) or higher (that is, the impurity concentration is preferably 1 ppm or lower, far preferably 0.1 ppm or lower).

In the case where the insulating film 407 contains oxygen and the heat treatment is performed on the state where the oxide semiconductor film is in contact with the insulating film 407, oxygen can be further supplied to the oxide semiconductor film from the insulating film 407 containing oxygen.

It is preferable to form the insulating film 409 over the insulating film 407, as a protective insulating film for blocking to prevent entrance of an impurity such as moisture or hydrogen into the oxide semiconductor film 403 and to prevent discharge of oxygen from the gate insulating film 402, the oxide semiconductor film 403, the insulating film 407, and an interface thereof. As the insulating film 409, it is preferable to use an inorganic insulating film such as a silicon nitride film, an aluminum oxide film, or the like. For example, a silicon nitride film is formed by an RF sputtering method. An RF sputtering method is preferable as a method for forming the insulating film 409 because of its high productivity.

Heat treatment may be performed after the insulating film 409 is formed. For example, the heat treatment may be performed at a temperature higher than or equal to 100° C. and lower than or equal to 200° C. in the air for 1 hour to 30 hours. This heat treatment may be performed at a fixed heating temperature; alternatively, the following change in the heating temperature may be conducted plural times: the heating temperature is increased from room temperature to a temperature higher than or equal to 100° C. and lower than or equal to 200° C. and then decreased to room temperature.

Figure 3C:
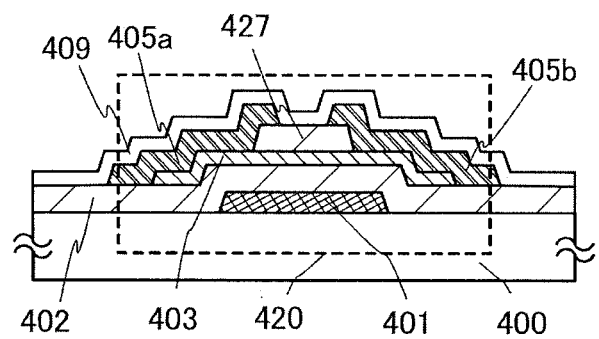
Figure 3D:
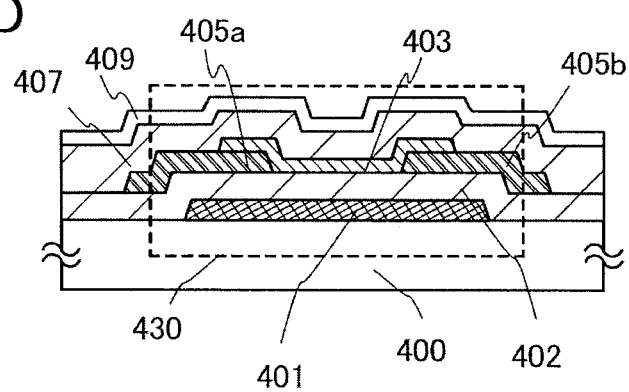

Other structures of transistors including an oxygen-excessive region subjected to oxygen doping treatment are shown in FIGS. 3C and 3D.

A transistor 420 illustrated in FIG. 3C is one of bottom-gate transistors referred to as a channel-protective (channel-stop) transistor and is also referred to as an inverted-staggered transistor.

The transistor 420 includes, over the substrate 400 having an insulating surface, the gate electrode layer 401, the gate insulating film 402, the oxide semiconductor film 403, an insulating film 427 functioning as a channel protective layer covering a channel formation region of the oxide semiconductor film 403, the source electrode layer 405a, and the drain electrode layer 405b. The insulating film 409 is formed so as to cover the transistor 420.

A transistor 430 shown in FIG. 3D is a bottom-gate transistor and includes, over the substrate 400 having an insulating surface, the gate electrode layer 401, the gate insulating film 402, the source electrode layer 405a, the drain electrode layer 405b, and the oxide semiconductor film 403. The insulating film 407 which covers the transistor 430 and is in contact with the oxide semiconductor film 403 is provided. The insulating film 409 is provided over the insulating film 407.

In the transistor 430, the gate insulating film 402 is provided on and in contact with the substrate 400 and the gate electrode 401, and the source electrode 405a and the drain electrode 405b are provided on and in contact with the gate insulating film 402. Further, the oxide semiconductor film 403 is provided over the gate insulating film 402, the source electrode layer 405a, and the drain electrode layer 405b.

In each of the transistors 410, 420, 430, and 440 including the highly-purified oxide semiconductor film 403 according to this embodiment, the current in an off state (the off-state current) can be small.

Such a transistor including an oxide semiconductor film subjected to oxygen doping treatment is a transistor having high reliability in which the amount of change in threshold voltage of the transistor by the bias-temperature stress (BT) test can be reduced.

Further, in the transistors 410, 420, 430, and 440 each including the oxide semiconductor film 403, relatively high field-effect mobility can be obtained, which enables high-speed operation. Consequently, with the above transistor provided in a pixel portion of a semiconductor device having a display function, high-quality images can be displayed. In addition, by using the transistor including the highly purified oxide semiconductor film, a driver circuit portion and a pixel portion can be formed over one substrate, whereby the number of components of the semiconductor device can be reduced.

In this manner, a semiconductor device including an oxide semiconductor, which has stable electric characteristics, can be provided. Accordingly, a semiconductor device with high reliability can be provided.

(Embodiment 2)

In Embodiment 2, another embodiment of a semiconductor device and one embodiment of a method for manufacturing the semiconductor device will be described using FIGS. 4A to 4F and 5A to 5C. In this embodiment, a transistor including an oxide semiconductor film will be described as an example of a semiconductor device. The same portions as and portions having functions similar to those described in Embodiment 1 can be formed in a manner similar to that described in Embodiment 1; therefore, description thereof is omitted. In addition, detailed description of the same portions is omitted.

An example of a method for manufacturing a transistor 450 is shown in FIGS. 4A to 4F and 5A to 5C. In this embodiment, oxygen doping treatment is performed plural times in a manufacturing process of the transistor 450.

First, a conductive film is formed over the substrate 400 having an insulating surface and is subjected to a first photolithography step to form the gate electrode layer 401.

Figure 4A:
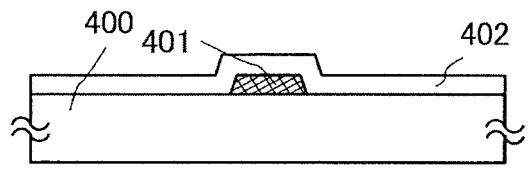
FIGS. 4A to 4F illustrate one embodiment of a method for manufacturing a semiconductor device.
Figure 4B:
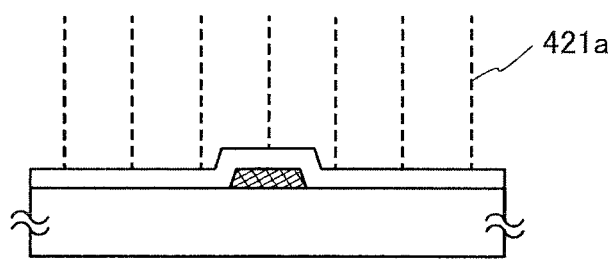

Next, the gate insulating film 402 is formed over the gate electrode layer 401 (see FIG. 4A).

Next, oxygen doping treatment is performed on the gate insulating film 402. By the oxygen doping treatment on the gate insulating film 402, oxygen 421a is supplied to the gate insulating film 402, so that oxygen is contained in the gate insulating film 402 and/or the vicinity of the interfaces (see FIG. 4B). In that case, the amount of oxygen contained is made to greater than the stoichiometric proportion of the gate insulating film 402, preferably to greater than the stoichiometric proportion and less than four times as much as the stoichiometric proportion thereof, far preferably to greater than the stoichiometric proportion and less than double of the stoichiometric proportion thereof. It can be alternatively said that the amount of oxygen contained is made to greater than Y, where the amount of oxygen of a material of the gate insulating film in the case where the material is a single crystal is denoted by Y, preferably to greater than Y and less than 4Y, far preferably to greater than Y and less than 2Y. It can be further alternatively said that the amount of oxygen contained is made to greater than Z, where the amount of oxygen contained in a gate insulating film which is subjected to no oxygen doping treatment is denoted by Z, preferably to greater than Z and less than 4Z, far preferably to greater than Z and less than 2Z. The oxygen 421a for doping contains an oxygen radical, an oxygen atom, and/or an oxygen ion.

For example, in the case of using an oxide insulating film the composition of which is represented by $GaO_x$ (x>0), since the stoichiometric proportion of gallium oxide is Ga:O=1:1.5, an oxide insulating film including an oxygen-excessive region where x is greater than 1.5 and less than 6 is formed. For example, in the case of using an oxide insulating film the composition of which is represented by $SiO_x$ (x>0), since the stoichiometric proportion of silicon oxide is Si:O=1:2, an oxide insulating film including an oxygen-excessive region where x is greater than 2 and less than 8 is formed. Such an oxygen-excessive region may exist in a part of the gate insulating film (including its interface). In this manner, the amount of oxygen is made to greater than that of hydrogen in the gate insulating film.

Oxygen for the doping may be supplied from a radical generating apparatus with use of a gas including oxygen or from an ozone generating apparatus. More specifically, for example, the oxygen 421a can be generated with an apparatus for etching treatment on a semiconductor device, an apparatus for ashing on a mask, or the like to process the gate insulating film 402.

In addition, heat treatment (at 150° C. to 470° C.) may be performed on the gate insulating film 402 which has been subjected to the oxygen doping treatment. By the heat treatment, water or hydroxide generated by reaction between the oxygen 421a and the gate insulating film 402 can be removed from the gate insulating film 402. The heat treatment may be performed under an atmosphere of nitrogen, oxygen, an ultra dry air (the moisture amount is less than or equal to 20 ppm (−55° C. by conversion into a dew point), preferably less than or equal to 1 ppm, far preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas is preferably highly purified without containing water, hydrogen, or the like.

In order that hydrogen, a hydroxyl group, and moisture are contained as little as possible in the gate insulating film 402 and the oxide semiconductor film provided over the gate insulating film 402, it is preferable that the substrate 400 over which the gate electrode layer 401 is formed or the substrate 400 which has been subjected to the manufacturing process up to and including the step for forming the gate insulating film 402 be preheated in a preheating chamber of a sputtering apparatus as pretreatment for the formation of the oxide semiconductor film, so that impurities such as hydrogen and moisture adsorbed to the substrate 400 are eliminated and removed. As an exhaustion unit provided in the preheating chamber, a cryopump is preferable. This preheating treatment is not necessarily performed. Further, this preheating may be performed on the substrate 400 which has been subjected to the manufacturing process up to and including the step for forming the source electrode layer 405a and the drain electrode layer 405b, before the formation of the insulating film 407.

Next, over the gate insulating film 402, an oxide semiconductor film with a thickness of greater than or equal to 2 nm and less than or equal to 200 nm, preferably greater than or equal to 5 nm and less than or equal to 30 nm is formed.

In this embodiment, the oxide semiconductor film is formed by a sputtering method using an In—Ga—Zn—O-based oxide semiconductor target. The oxide semiconductor film can be formed by a sputtering method in a rare gas (typically, argon) atmosphere, an oxygen atmosphere, or a mixed atmosphere of a rare gas and oxygen.

The target used for formation of the oxide semiconductor film by a sputtering method is, for example, an oxide target containing $In_2O_3$, $Ga_2O_3$, and ZnO at a composition ratio of 1:1:1 [molar ratio], so that an In—Ga—Zn—O film can be formed.

It is preferable that a high-purity gas from which an impurity such as hydrogen, water, a hydroxyl group, or hydride is removed be used as a sputtering gas used for forming the oxide semiconductor film.

As one example of the film formation condition, the following is employed: the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current power source is preferably used, in which case powder substances (also referred to as particles or dust) that are generated in deposition can be reduced and the film thickness can be uniform.

Figure 4C:
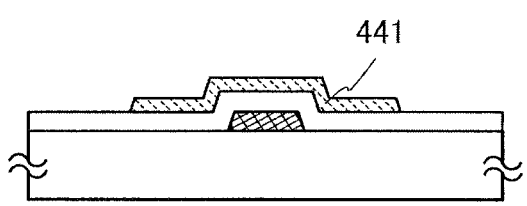
Figure 4D:
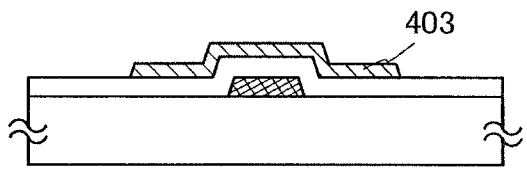
Figure 4E:
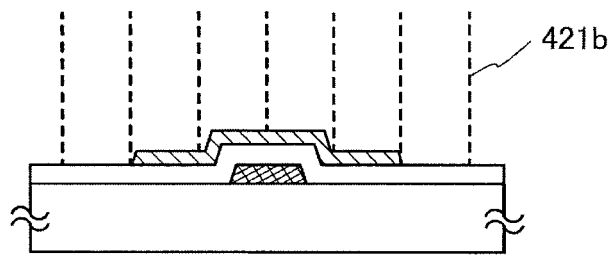
Figure 4F:
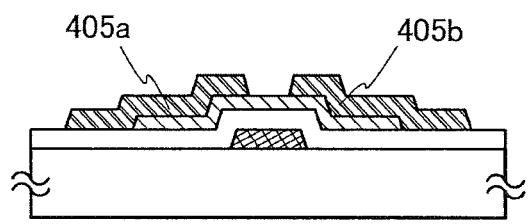

Next, the oxide semiconductor film is processed into the island-shaped oxide semiconductor film 441 through a second photolithography step (see FIG. 4C).

Next, the oxide semiconductor film 441 is subjected to heat treatment. With this heat treatment, excessive hydrogen (including water and a hydroxyl group) can be removed (dehydration or dehydrogenation), the structure of the oxide semiconductor film can be improved, and defect levels in an energy gap can be reduced. The temperature of the heat treatment is higher than or equal to 250° C. and lower than or equal to 750° C., or higher than or equal to 400° C. and lower than the strain point of the substrate. In this embodiment, the substrate is put in an electric furnace which is a kind of heat treatment apparatus and the oxide semiconductor film is subjected to heat treatment at 450° C. for one hour in a nitrogen atmosphere, and then, water and hydrogen are prevented from being mixed into the oxide semiconductor film by preventing the substrate from being exposed to the air; thus, the oxide semiconductor film 403 is obtained (see FIG. 4D).

The heat treatment apparatus is not limited to the electric furnace, and an apparatus for heating an object by heat conduction or heat radiation from a heater such as a resistance heater may be used.

For example, as the heat treatment, GRTA may be performed, in which the substrate is moved into an inert gas heated at a high temperature of 650° C. to 700° C., and heated for several minutes, and then the substrate is moved out of the inert gas.

The heat treatment can also be performed on the oxide semiconductor film before the oxide semiconductor film is processed into the island-shaped oxide semiconductor film. In that case, after the heat treatment, the substrate is taken out of the heating apparatus and a photolithography step is performed on the oxide semiconductor film. The heat treatment may be performed after a source electrode layer and a drain electrode layer are formed over the island-shaped oxide semiconductor film as long as the oxide semiconductor film is formed before that heat treatment.

Next, oxygen doping treatment is performed on the dehydrated or dehydrogenated oxide semiconductor film 403. By the oxygen doping treatment on the oxide semiconductor film 403, oxygen 421*b* is supplied to the oxide semiconductor film 403, so that oxygen is contained in the oxide semiconductor film 403 and/or the vicinity of the interface (see FIG. 4E). In that case, the amount of oxygen contained is made to greater than the stoichiometric proportion of the oxide semiconductor film 403, preferably to greater than the stoichiometric proportion and less than double of the stoichiometric proportion. It can be alternatively said that the amount of oxygen contained is made to greater than Y, where the amount of oxygen contained in a single crystalline semiconductor film is denoted by Y, preferably to greater than Y and less than 2Y. It can be further alternatively said that the amount of oxygen contained is made to greater than Z, where the amount of oxygen contained in an oxide semiconductor film which is subjected to no oxygen doping treatment is denoted by Z, preferably to greater than Z and less than 2Z. Too much of oxygen content may lead to absorption of hydrogen into the oxide semiconductor film 403, like a hydrogen storing alloy (hydrogen storage alloy). The oxygen 421*b* for doping contains an oxygen radical, an oxygen atom, and/or an oxygen ion.

For example, in the case of using a material a single crystal structure of which is represented by $InGaO_3(ZnO)_m$ (m>0), the composition of the oxide semiconductor film 403 is represented by $InGaZn_mO_x$; therefore, in the case where m is 1 ($InGaZnO_4$), the acceptable x is greater than 4 and less than 8, and in the case where m is 2 ($InGaZn_2O_5$), the acceptable x is greater than 5 and less than 10. Such an oxygen-excessive region may exist in a part of the oxide semiconductor film (including its interface). In this manner, the amount of oxygen is made to greater than that of hydrogen in the oxide semiconductor film.

In the oxide semiconductor film, oxygen is one of main component materials. Therefore, it is difficult to estimate the oxygen concentration of the oxide semiconductor film accurately with Secondary Ion Mass Spectrometry (SIMS) or the like. That is, it is difficult to judge whether oxygen is intentionally added to the oxide semiconductor film or not.

Isotopes such as $^{17}O$ or $^{18}O$ exist in oxygen, and it is know that the existence proportions of them in nature are about 0.037% and about 0.204% of the whole oxygen atoms. Therefore, the concentration of such an isotope in the oxide semiconductor film can be estimated by SIMS or the like, and the measurement of such a concentration enables the oxygen concentration in the oxide semiconductor film to be estimated accurately. Thus, by measuring the concentration, whether oxygen is intentionally added to the oxide semiconductor film or not may be judged.

For example, with respect to the concentration of $^{18}O$, a concentration of the isotope of oxygen $D1(^{18}O)$ in an oxygen-added region and a concentration of the isotope of oxygen $D2(^{18}O)$ in a no-oxygen-added region have a relationship represented by $D1(^{18}O) > D2(^{18}O)$.

The oxygen 421*b* added to (contained in) the oxide semiconductor film preferably has at least partly a dangling bond of oxygen in the oxide semiconductor. This is because the dangling bond can be bonded with hydrogen left in the film to immobilize hydrogen (make hydrogen an immovable ion).

Oxygen for the doping (an oxygen radical, an oxygen atom, and/or an oxygen ion) may be supplied from a radical generating apparatus with use of a gas including oxygen or from an ozone generating apparatus. More specifically, for example, the oxygen 421*b* can be generated with an apparatus for etching treatment on a semiconductor device, an apparatus for ashing on a resist mask, or the like to process the oxide semiconductor film 403.

It is preferable to electrically bias the substrate in order to add oxygen more preferably.

In addition, heat treatment (at 150° C. to 470° C.) may be performed on the oxide semiconductor film 403 which has been subjected to the oxygen doping treatment. By the heat treatment, water or hydroxide generated by reaction between the oxygen 421*b* and the oxide semiconductor film 403 can be removed from the oxide semiconductor film 403. The heat treatment may be performed under an atmosphere of nitrogen, oxygen, an ultra dry air (the moisture amount is less than or equal to 20 ppm (−55° C. by conversion into a dew point), preferably less than or equal to 1 ppm, far preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas is preferably highly purified without containing water, hydrogen, or the like.

Through the above steps, the oxide semiconductor film 403 is highly purified and is made electrically i-type (intrinsic).

Since the amount of oxygen contained in the gate insulating film 402 is excessive because of the oxygen doping treatment performed on the gate insulating film 402, oxygen transfer from the oxide semiconductor film 403 stacked on can be suppressed. Further, since the oxide semiconductor film 403 is stacked on and in contact with the gate insulating film 402 subjected to the oxygen doping treatment, oxygen can be supplied from the gate insulating film 402 (bulk thereof and/or interface thereof) to the gate insulating film 402. The oxygen supply from the gate insulating film 402 to the oxide semiconductor film 403 is further promoted by heat treatment on a state where the gate insulating film 402 subjected to the oxygen doping treatment is in contact with the oxide semiconductor film 403.

The oxygen 421a added to the gate insulating film 402 and supplied to the oxide semiconductor film 403 preferably has at least partly a dangling bond of oxygen in the oxide semiconductor. This is because the dangling bond can be bonded with hydrogen left in the film to immobilize hydrogen (make hydrogen an immovable ion).

The oxygen doping treatment on the oxide semiconductor film may be performed on the oxide semiconductor film before the oxide semiconductor film is processed into the island-shaped oxide semiconductor film or after a source electrode layer and a drain electrode layer are stacked on the island-shaped oxide semiconductor film as long as the heat treatment is performed before that oxygen doping treatment.

Next, a conductive film for forming a source electrode layer and a drain electrode layer (including a wiring formed of the same layer as the source electrode layer and the drain electrode layer) is formed over the gate insulating film 402 and the oxide semiconductor film 403.

A resist mask is formed over the conductive film by a third photolithography step, and is selectively etched, so that the source electrode layer 405a and the drain electrode layer 405b are formed. Then, the resist mask is removed (see FIG. 4F).

It is preferable that etching conditions be optimized so as not to etch and cut the oxide semiconductor film 403 when the conductive film is etched. However, it is difficult to obtain etching conditions in which only the conductive film is etched and the oxide semiconductor film 403 is not etched at all. In some cases, part of the oxide semiconductor film 441 is etched off through the etching of the conductive film, so that an oxide semiconductor film having a groove portion (a depressed portion) is formed.

In this embodiment, a Ti film is used as the conductive film and an In—Ga—Zn—O-based oxide semiconductor is used as the oxide semiconductor film 403, and therefore, ammonium hydrogen peroxide (a mixture of ammonia, water, and hydrogen peroxide) is used as an etchant.

The number of carriers in the highly purified oxide semiconductor film 403 is significantly small (close to zero).

Figure 5A:
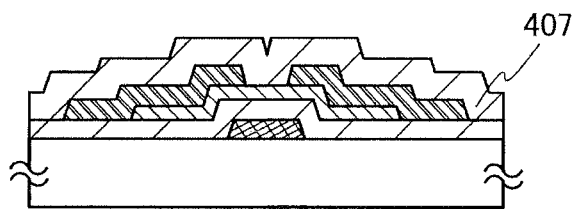
FIGS. 5A to 5C illustrate one embodiment of a method for manufacturing a semiconductor device.
Figure 5B:
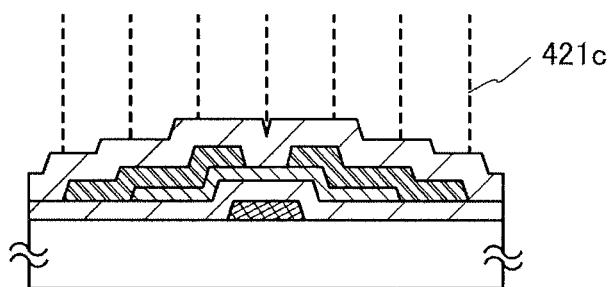

Next, the insulating film 407 is formed over the oxide semiconductor film 403, the source electrode layer 405a, and the drain electrode layer 405b (see FIG. 5A).

The insulating film 407 can be formed to a thickness of at least 1 nm by a method by which an impurity such as water and hydrogen does not enter the insulating film 407, such as a sputtering method, as appropriate.

As the insulating film 407, an inorganic insulating film such as a silicon oxide film, a silicon oxynitride film, an aluminum oxide film, an aluminum oxynitride film, or a gallium oxide film can be typically used.

It is far preferable that an insulating material containing a component/components similar to the oxide semiconductor film 403 be used for the insulating film 407, like the gate insulating film 402. This is because such a material can be fit well to the oxide semiconductor film, and therefore, this use for the insulating film 407 enables a state of an interface between the insulating film and the oxide semiconductor film to be kept well. For example, in the case where the oxide semiconductor film is formed using an In—Ga—Zn-based oxide semiconductor material, gallium oxide can be given as an example of the insulating material containing the component(s) similar to the oxide semiconductor film 403.

It is preferable to perform heat treatment after the formation of the insulating film 407. The heat treatment is performed at a temperature higher than or equal to 250° C. and lower than or equal to 700° C., preferably higher than or equal to 450° C. and lower than or equal to 600° C. or less than a strain point of the substrate.

The heat treatment may be performed under an atmosphere of nitrogen, oxygen, an ultra dry air (the moisture amount is less than or equal to 20 ppm (−55° C. by conversion into a dew point), preferably less than or equal to 1 ppm, far preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas preferably contains water, hydrogen, or the like as less as possible. The purity of nitrogen, oxygen, or the rare gas which is introduced into the heat treatment apparatus is set to preferably 6N (99.9999%) or higher, far preferably 7N (99.99999%) or higher (that is, the impurity concentration is preferably 1 ppm or lower, far preferably 0.1 ppm or lower).

In the case where the insulating film 407 contains oxygen and the heat treatment is performed on the state where the oxide semiconductor film is in contact with the insulating film 407, oxygen can be further supplied to the oxide semiconductor film from the insulating film 407 containing oxygen.

Next, oxygen doping treatment is performed on the insulating film 407. By the oxygen doping treatment on the insulating film 407, oxygen 421c is supplied to the insulating film 407, so that oxygen is contained in the oxide semiconductor film 403, the gate insulating film 402, and/or the vicinity of the interface(s) of the oxide semiconductor film 403 and/or the gate insulating film 402 (see FIG. 5B). In that case, the amount of oxygen contained is made to greater than the stoichiometric proportion of the insulating film 407, preferably to greater than the stoichiometric proportion and less than four times as much as the stoichiometric proportion thereof, far preferably to greater than the stoichiometric proportion and less than double of the stoichiometric proportion thereof. It can be alternatively said that the amount of oxygen contained is made to greater than Y, where the amount of oxygen contained in a material of the insulating film in the case where the material is a single crystal is denoted by Y, preferably to greater than Y and less than 4Y, far preferably to greater than Y and less than 2Y. It can be further alternatively said that the amount of oxygen contained is made to greater than Z, where the amount of oxygen contained in an insulating film which is subjected to no oxygen doping treatment is denoted by Z, preferably to greater than Z and less than 4Z, far preferably to greater than Z and less than 2Z. The oxygen 421c for doping contains an oxygen radical, an oxygen atom, and/or an oxygen ion.

For example, in the case of using an oxide insulating film the composition of which is represented by $GaO_x$ (x>0), since the stoichiometric proportion of gallium oxide is Ga:O=1:1.5, an insulating film including an oxygen-excessive region where x is greater than 1.5 and less than 6 is formed. For example, in the case of using an oxide insulating film the composition of which is represented by $SiO_x$ (x>0), since the stoichiometric proportion of silicon oxide is Si:O=1:2, an insulating film including an oxygen-excessive region where x is greater than 2 and less than 8 is formed. Such an oxygen-excessive region may exist in a part of the insulating film (including its interface). In this manner, the amount of oxygen is made to greater than that of hydrogen in the insulating film.

The oxygen 421c added to (contained in) the insulating film 407 preferably has at least partly a dangling bond of oxygen in the oxide semiconductor. This is because the dangling bond can be bonded with hydrogen left in the film to immobilize hydrogen (make hydrogen an immovable ion).

Oxygen for the doping (an oxygen radical, an oxygen atom, and/or an oxygen ion) may be supplied from a radical generating apparatus with use of a gas including oxygen or from an ozone generating apparatus. More specifically, for example, the oxygen 421c can be generated with an apparatus for etching treatment on a semiconductor device, an apparatus for ashing on a mask, or the like to process the insulating film 407.

In addition, heat treatment (at 150° C. to 470° C.) may be performed on the insulating film 407 which has been subjected to the oxygen doping treatment. By the heat treatment, water or hydroxide generated by reaction between the oxygen 421c and the insulating film 407 can be removed from the insulating film 407. The heat treatment may be performed under an atmosphere of nitrogen, oxygen, an ultra dry air (the moisture amount is less than or equal to 20 ppm (−55° C. by conversion into a dew point), preferably less than or equal to 1 ppm, far preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas is preferably highly purified without containing water, hydrogen, or the like.

It is preferable to form the insulating film 409 over the insulating film 407, as a protective insulating film for blocking to prevent entrance of an impurity such as moisture or hydrogen into the oxide semiconductor film 403. As the insulating film 409, it is preferable to use an inorganic insulating film such as a silicon nitride film, an aluminum oxide film, or the like. For example, a silicon nitride film is formed by an RF sputtering method. An RF sputtering method is preferable as a method for forming the insulating film 409 because of its high productivity.

Heat treatment may be performed after the insulating film is formed. For example, the heat treatment may be performed at a temperature higher than or equal to 100° C. and lower than or equal to 200° C. in the air for 1 hour to 30 hours. This heat treatment may be performed at a fixed heating temperature; alternatively, the following change in the heating temperature may be conducted plural times: the heating temperature is increased from room temperature to a temperature higher than or equal to 100° C. and lower than or equal to 200° C. and then decreased to room temperature.

Figure 5C:
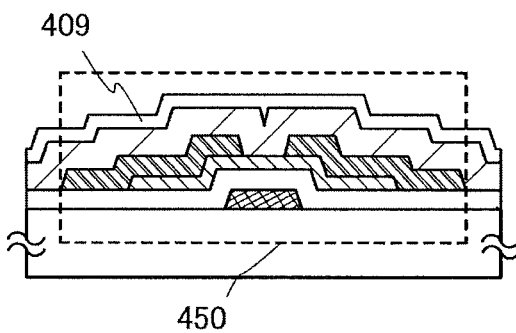

Through the above process, the transistor 450 is formed (see FIG. 5C). The transistor 450 is a transistor including the oxide semiconductor film 403 which is highly purified and from which an impurity such as hydrogen, moisture, a hydroxyl group, or hydride (also referred to as a hydrogen compound) is removed. Therefore, variation in the electric characteristics of the transistor 450 is suppressed and the transistor 450 is electrically stable.

In the transistor 450 including the highly-purified oxide semiconductor film 403 in accordance with this embodiment, the current value in an off-state (off-current value) thereof can be low.

As described above, the oxygen doping treatment can be performed not only on the gate insulating film 402 but also on the oxide semiconductor film 403 and/or the insulating film 407. The oxygen doping treatment may be performed on either one or both of the oxide semiconductor film 403 and the insulating film 407.

In addition, heat treatment (at 150° C. to 470° C.) may be performed after the oxygen doping treatment is performed. The heat treatment may be performed under an atmosphere of nitrogen, oxygen, an ultra dry air (the dew point is less than or equal to −60° C., preferably less than or equal to −80° C. in the measurement with the use of a dew point meter of a cavity ring down laser spectroscopy (CRDS) system), or a rare gas (argon, helium, or the like). The atmosphere of nitrogen, oxygen, the ultra dry air, or the rare gas is preferably highly purified without containing water, hydrogen, or the like.

With the heat treatment, oxygen can be supplied further effectively from the gate insulating film 402 subjected to the oxygen doping treatment to the oxide semiconductor film 403.

Such a transistor including an oxide semiconductor film subjected to oxygen doping treatment is a transistor having high reliability in which the amount of change in threshold voltage of the transistor by the bias-temperature stress (BT) test can be reduced.

Further, in the transistor 450 including the oxide semiconductor film 403, relatively high field-effect mobility can be obtained, which enables high-speed operation. Consequently, with the above transistor provided in a pixel portion of a semiconductor device having a display function, high-quality images can be displayed. In addition, by using the transistor including the highly purified oxide semiconductor film, a driver circuit portion and a pixel portion can be formed over one substrate, whereby the number of components of the semiconductor device can be reduced.

In this manner, a semiconductor device including an oxide semiconductor, which has stable electric characteristics, can be provided. Accordingly, a semiconductor device with high reliability can be provided.

(Embodiment 3)

In Embodiment 3, another embodiment of a semiconductor device will be described using FIGS. 13A to 13D. The same portions as and portions having functions similar to those described in Embodiment 1 or 2 can be formed in a manner similar to that described in Embodiment 1 or 2; therefore, description thereof is omitted. In addition, detailed description of the same portions is omitted.

In this embodiment, an example of a structure will be described in which a source electrode layer and/or a drain electrode layer of a transistor are/is connected to a conductive layer (such as a wiring layer or a pixel electrode layer). Note that this embodiment can also be applied to any of the transistors described in Embodiments 1 and 2.

Figure 13A:
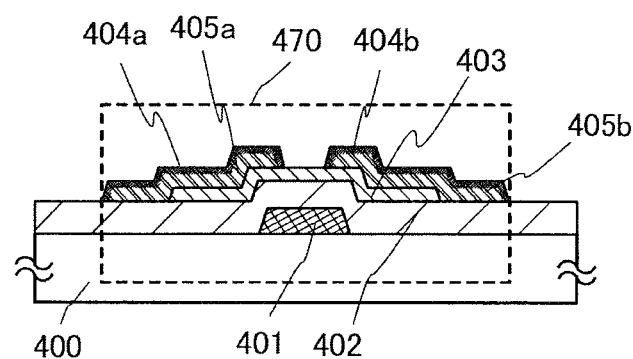
FIGS. 13A to 13D illustrate one embodiment of a semiconductor device.

As shown in FIG. 13A, a transistor 470 includes, over the substrate 400 having an insulating surface, the gate electrode layer 401, the gate insulating film 402, the oxide semiconductor film 403, the source electrode layer 405a, and the drain electrode layer 405b.

As is described in Embodiment 2, oxygen doping is also performed on the oxide semiconductor film 403 in addition to the gate insulating film 402, after the heat treatment for dehydration or dehydrogenation also in a manufacturing process of the transistor 470. The transistor 470 in this embodiment is an example in which the source electrode layer 405a and the drain electrode layer 405b are formed over the oxide semiconductor film 403 which has been subjected to heat treatment for dehydration or dehydrogenation, and then oxygen doping is performed thereon.

With this oxygen doping, an oxygen radical, an oxygen atom, or an oxygen ion reaches and is delivered to (is introduced to the vicinity of top surfaces of) the source electrode layer 405a and the drain electrode layer 405b in addition to the oxide semiconductor film 403. Consequently, as shown in FIG. 13A, the top surfaces of the source electrode layer 405a and the drain electrode layer 405b irradiated with the oxygen radical, the oxygen atom, or the oxygen ion may be oxidized to form metal oxide regions 404a and 404b between the insulating film 407 and the source electrode layer 405a and the drain electrode layer 405b. The metal oxide regions 404a and 404b may each be in the form of a film.

Figure 13B:
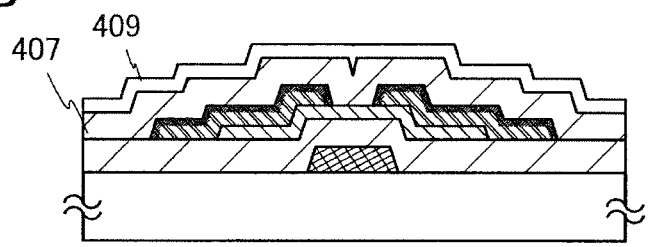

Next, the insulating film 407 and the insulating film 409 are sequentially stacked over the transistor 470 (see FIG. 13B).

Figure 13C:
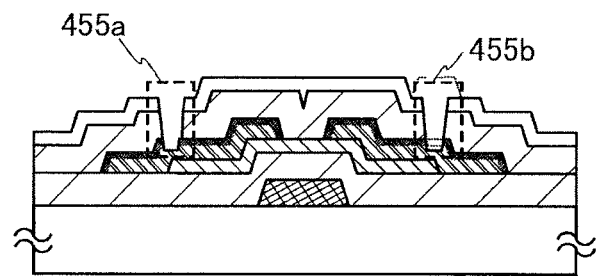

In the case of FIG. 13B, openings 455a and 455b where, over the insulating film 409, conductive layers connected to the source electrode layer 405a and the drain electrode layer 405b are formed are preferably formed so that parts of the metal oxide regions 404a and 404b having high resistance are removed to expose parts of the source electrode layer 405a and the drain electrode layer 405b having low resistance (see FIG. 13C). Parts of the insulating film 409, the insulating film 407, and the metal oxide regions 404a and 404b are removed to form the openings 455a and 455b. The source electrode layer 405a and the drain electrode layer 405b are partly removed to have depressions. The oxygen concentrations of regions of the source electrode layer 405a and the drain electrode layer 405b, which are exposed on the bottom surfaces of the depressions, are lower than those of regions of the metal oxide regions 404a and 404b, which are in the top surfaces of the source electrode layer 405a and the drain electrode layer 405b.

For example, the parts of the source electrode layer 405a and the drain electrode layer 405b may be removed from the top surfaces by a thickness one half or less than (preferably one third or less than) the thickness of the source electrode layer 405a, the drain electrode layer 405b in the openings 455a and 455b to remove parts of the metal oxide regions 404a and 404b formed in the surfaces of the source electrode layer 405a and the drain electrode layer 405b.

Figure 13D:
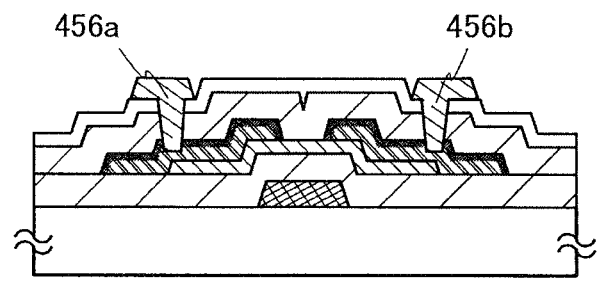

Next, conductive layers 456a and 456b are formed in contact with the source electrode layer 405a and the drain electrode layer 405b exposed in the openings 455a and 455b (see FIG. 13D). The conductive layers 456a and 456b are formed directly in contact with the source electrode layer 405a and the drain electrode layer 405b having low resistance without the metal oxide regions 404a and 404b having high resistance provided therebetween; thus, favorable electrical connection (contact) can be made.

An insulating film may be formed over the conductive layers 456a and 456b, as a protective layer to cover the transistor 470. Moreover, by covering the insulating film, it is possible to prevent impurities such as hydrogen and moisture from entering the oxide semiconductor film 403 from the openings 455a and 455b.

In this manner, favorable electrical connection of a transistor can be obtained and a semiconductor device including an oxide semiconductor with stable electrical characteristics can be provided. Therefore, a semiconductor device with high reliability can be provided.

(Embodiment 4)

In Embodiment 4, an example of a plasma apparatus (also referred to as an ashing apparatus) which can be used for oxygen doping treatment will be described. This apparatus is industrially suitable as compared to an ion implantation apparatus or the like because the apparatus can be applicable for a large-sized substrate of the fifth generation or later, for example.

Figure 14A:
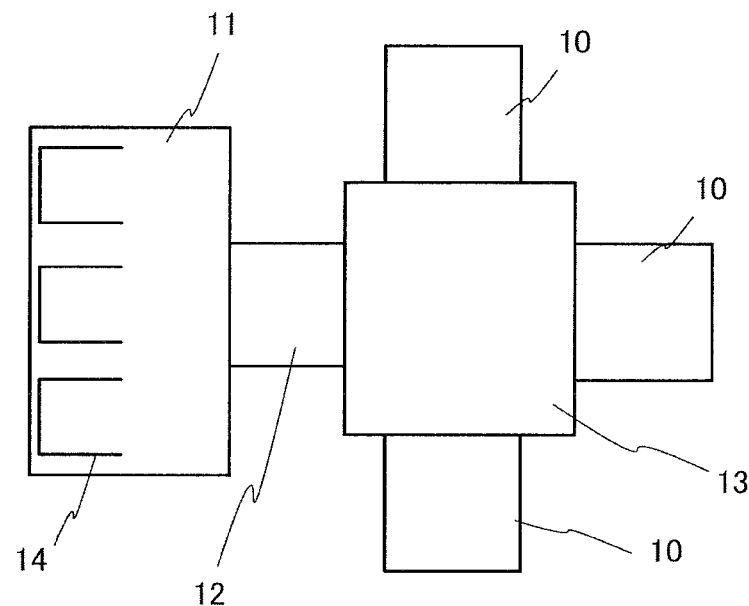
FIG. 14A is a top view of a plasma apparatus illustrating one embodiment of the present invention.
Figure 14B:
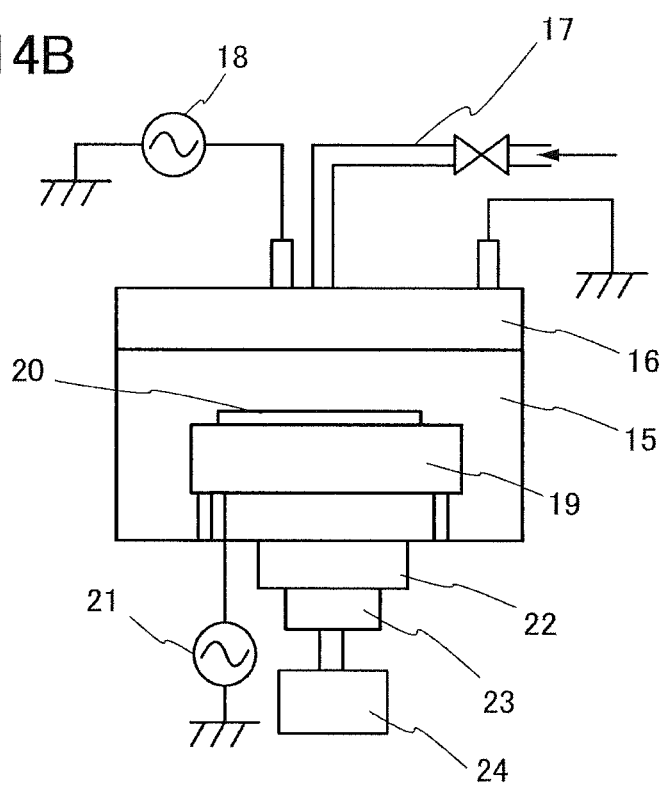
FIG. 14B is a cross-sectional view thereof.
Figure 15:
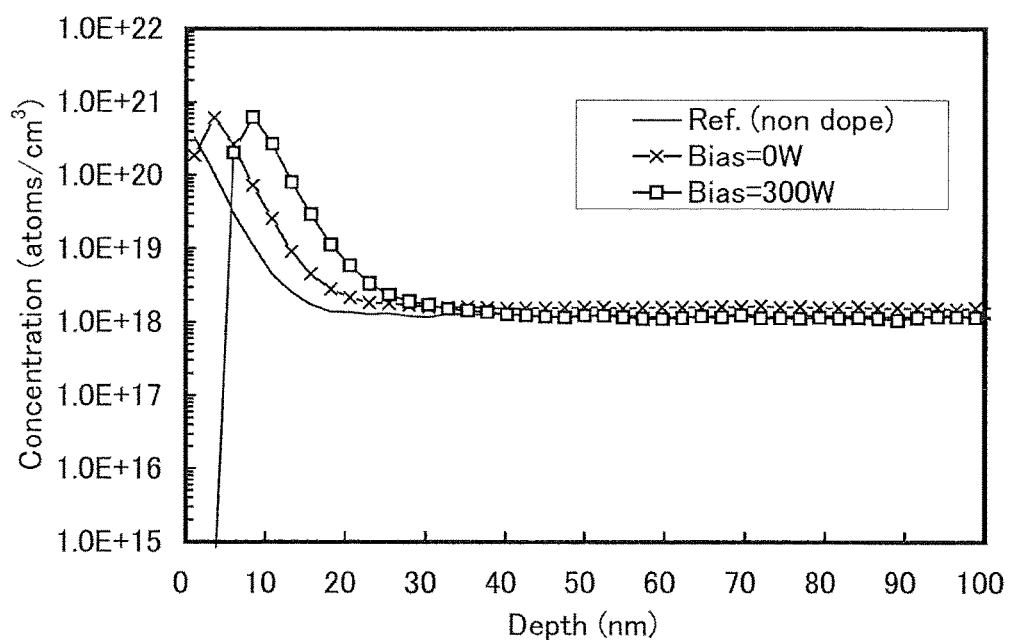
FIG. 15 is a graph showing measurement results with SIMS.
Figure 16A:
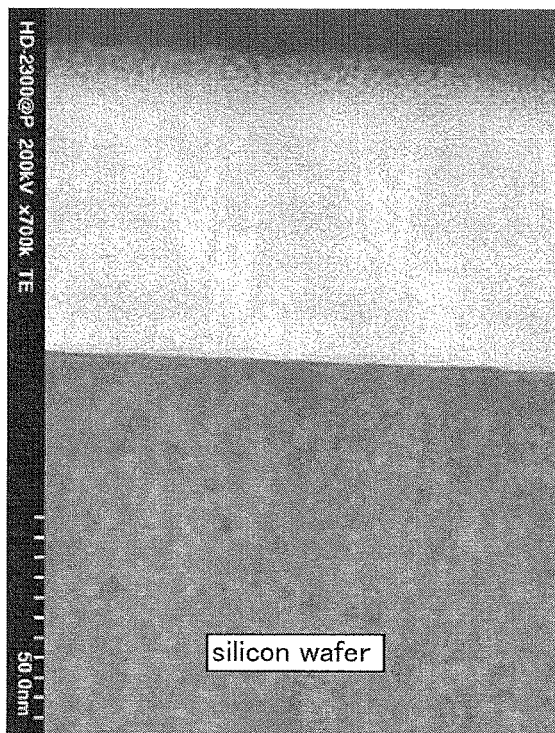
FIGS. 16A and 16B are cross-sectional STEM images.
Figure 16B:
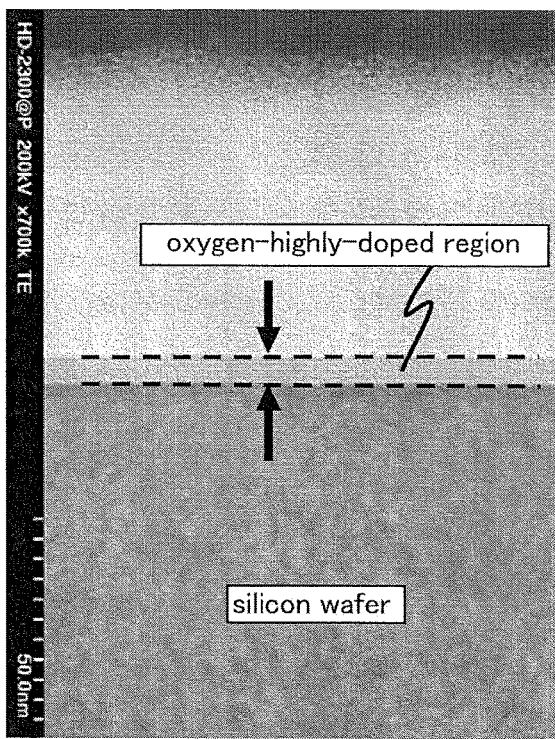

FIG. 14A illustrates an example of a top view of a single wafer multi-chamber equipment. FIG. 14B illustrates an example of a cross-sectional view of a plasma apparatus (also referred to as an ashing apparatus) used for oxygen doping.

The single wafer multi-chamber equipment illustrated in FIG. 14A includes three plasma apparatuses 10 each of which is shown in FIG. 14B, a substrate supply chamber 11 including three cassette ports 14 for holding a process substrate, a load lock chamber 12, a transfer chamber 13, and the like. A substrate supplied to the substrate supply chamber 11 is transferred through the load lock chamber 12 and the transfer chamber 13 to a vacuum chamber 15 in the plasma apparatus 10 and is subjected to oxygen doping. The substrate which has been subjected to oxygen doping is transferred from the plasma apparatus 10, through the transfer chamber 13 and the load lock chamber 12 to the substrate supply chamber. A transfer robot for transferring a process substrate is provided in each of the substrate supply chamber 11 and the transfer chamber 13.

Referring to FIG. 14B, the plasma apparatus 10 includes the vacuum chamber 15. A plurality of gas outlets and an ICP coil (an inductively coupled plasma coil) 16 which is a generation source of plasma are provided on a top portion of the vacuum chamber 15.

The number of gas outlets arranged in a center portion, seen from the top of the plasma apparatus 10 is 12. Each of the gas outlets is connected to a gas supply source for supplying an oxygen gas, via a gas flow path 17. The gas supply source includes a mass flow controller and the like and can supply an oxygen gas to the gas flow pass 17 at a desired flow rate (which is greater than 0 sccm and less than or equal to 1000 sccm). The oxygen gas supplied from the gas supply source is supplied from the gate flow pass 17, through the 12 gas outlets, into the vacuum chamber 15.

The ICP coil 16 includes a plurality of strip-like conductors each of which has a spiral form. One end of each of the conductors is electrically connected to a first high-frequency power source 18 (13.56 MHz) via a matching circuit for controlling impedance, and the other end thereof is grounded.

A substrate stage 19 functioning as a bottom electrode is provided in a lower portion of the vacuum chamber. By an electrostatic chuck or the like provided for the substrate stage 19, a process substrate 20 is held on the substrate stage so as to be detachable. The substrate stage 19 is provided with a heater as a heating system and a He gas flow pass as a cooling system. The substrate stage is connected to a second high-frequency power source 21 (3.2 MHz) for applying a substrate bias power.

In addition, the vacuum chamber 15 is provided with an exhaust port and an automatic pressure control valve (also referred to as an APC) 22. The APC is connected to a turbo molecular pump 23 and connected to a dry pump 24 via the turbo molecular pump 23. The APC controls the inside pressure of the vacuum chamber. The turbo molecular pump 23 and the dry pump 24 reduce the inside pressure of the vacuum chamber 15.

Next, described is an example in which plasma is generated in the vacuum chamber 15 illustrated in FIG. 14B, and oxygen doping is performed on an oxide semiconductor film or a gate insulating film provided for the process substrate 20.

First, the inside pressure of the vacuum chamber 15 is held at a desired pressure by operating the turbo molecular pump 23, the dry pump 24, and the like, and then, the process substrate 20 is installed on the substrate stage in the vacuum chamber 15. The process substrate 20 held on the substrate stage has at least an oxide semiconductor film or a gate insulating film. In this embodiment, the inside pressure of the vacuum chamber 15 is held at 1.33 Pa. The flow rate of the oxygen gas supplied through the gas outlets into the vacuum chamber 15 is set at 250 sccm.

Next, a high-frequency power is applied from the first high-frequency power source 18 to the ICP coil 16, thereby generating plasma. Then, a state in which plasma is being generated is kept for a certain period (longer than or equal to 30 seconds and shorter than or equal to 600 seconds). The high-frequency power applied to the ICP coil 16 is greater than or equal to 1 kW and less than or equal to 10 kW. In this embodiment, the high-frequency power is set at 6000 W. At that time, a substrate bias power may be applied from the second high-frequency power source 21 to the substrate stage. In this embodiment, the power used for applying the substrate bias power is set at 1000 W.

In this embodiment, the state in which plasma is being generated is kept for 60 seconds and then, the process substrate 20 is transferred from the vacuum chamber 15. In this manner, oxygen doping can be performed on the oxide semiconductor film or the gate insulating film provided for the process substrate 20.

Embodiment 5 can be implemented in appropriate combination with any of the structures described in the other embodiments.

(Embodiment 5)

A semiconductor device having a display function (also referred to as a display device) can be manufactured using the transistor exemplified in any of Embodiments 1 to 3. Moreover, part or all of driver circuitry which include the transistor can be formed over a substrate where a pixel portion is formed, whereby a system-on-panel can be obtained.

Figure 12A:
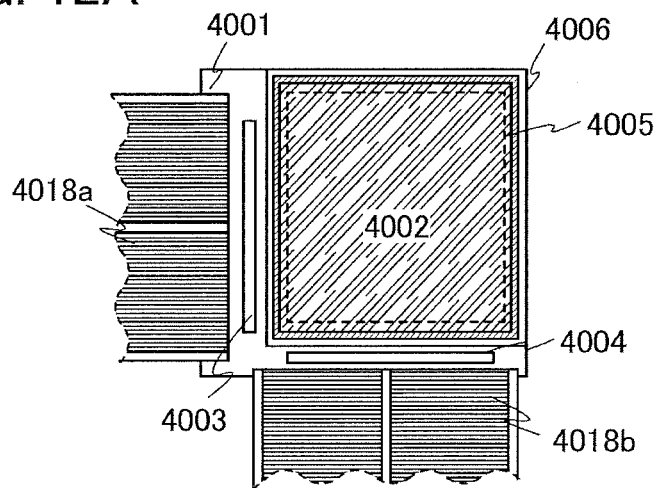
FIGS. 12A to 12C illustrate embodiments of a semiconductor device.

In FIG. 12A, a sealant 4005 is provided so as to surround a pixel portion 4002 provided over a first substrate 4001, and the pixel portion 4002 is sealed with a second substrate 4006. In FIG. 12A, a signal line driver circuit 4003 and a scan line driver circuit 4004 which are formed using a single crystal semiconductor film or a polycrystalline semiconductor film over another substrate are mounted in a region that is different from the region surrounded by the sealant 4005 over the first substrate 4001. Various signals and potentials are supplied to the signal line driver circuit 4003, the scan line driver circuit 4004, and the pixel portion 4002 from flexible printed circuits (FPCs) 4018a and 4018b.

Figure 12B:
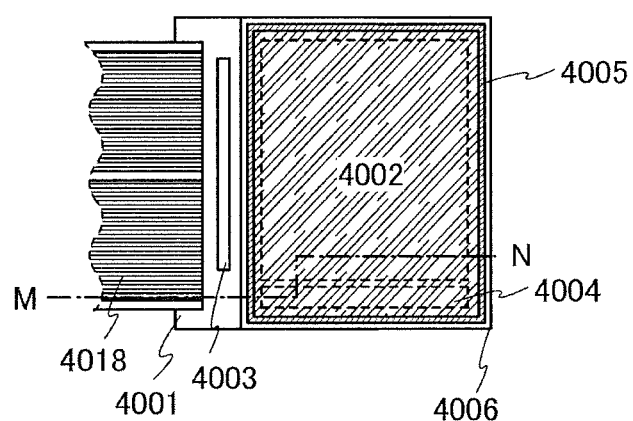
Figure 12C:
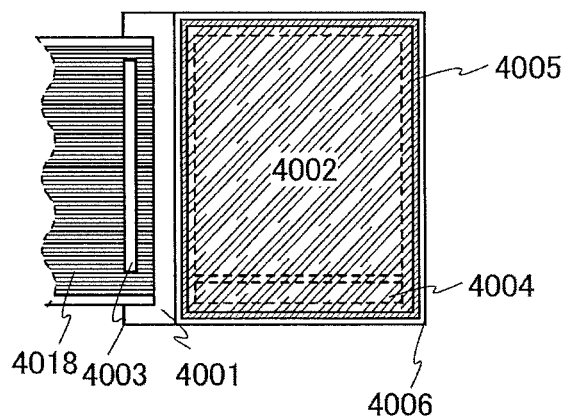

In FIGS. 12B and 12C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Accordingly, the pixel portion 4002 and the scan line driver circuit 4004 are sealed together with the display element, by the first substrate 4001, the sealant 4005, and the second substrate 4006. In FIGS. 12B and 12C, the signal line driver circuit 4003 which is formed using a single crystal semiconductor film or a polycrystalline semiconductor film over another substrate is mounted in a region that is different from the region surrounded by the sealant 4005 over the first substrate 4001. In FIGS. 12B and 12C, various signals and potential are supplied to the signal line driver circuit 4003, the scan line driver circuit 4004, and the pixel portion 4002 from an FPC 4018.

Although FIGS. 12B and 12C each illustrate an example in which the signal line driver circuit 4003 is separately formed and mounted on the first substrate 4001, an embodiment of the present invention is not limited to this structure. The scan line driver circuit may be separately formed and then mounted, or only part of the signal line driver circuit or part of the scan line driver circuit may be separately formed and then mounted.

A connection method of a separately formed driver circuit is not particularly limited; a chip on glass (COG) method, a wire bonding method, a tape automated bonding (TAB) method, or the like can be used. FIG. 12A illustrates an example in which the signal line driver circuit 4003 and the scan line driver circuit 4004 are mounted by a COG method. FIG. 12B illustrates an example in which the signal line driver circuit 4003 is mounted by a COG method. FIG. 12C illustrates an example in which the signal line driver circuit 4003 is mounted by a TAB method.

In addition, the display device includes a panel in which the display element is sealed, and a module in which an IC or the like including a controller is mounted on the panel.

Note that the display device in this specification means an image display device, a display device, or a light source (including a lighting device). Furthermore, the display device also includes the following in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors; any of the transistors which are described in Embodiments 1 to 3 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 6:
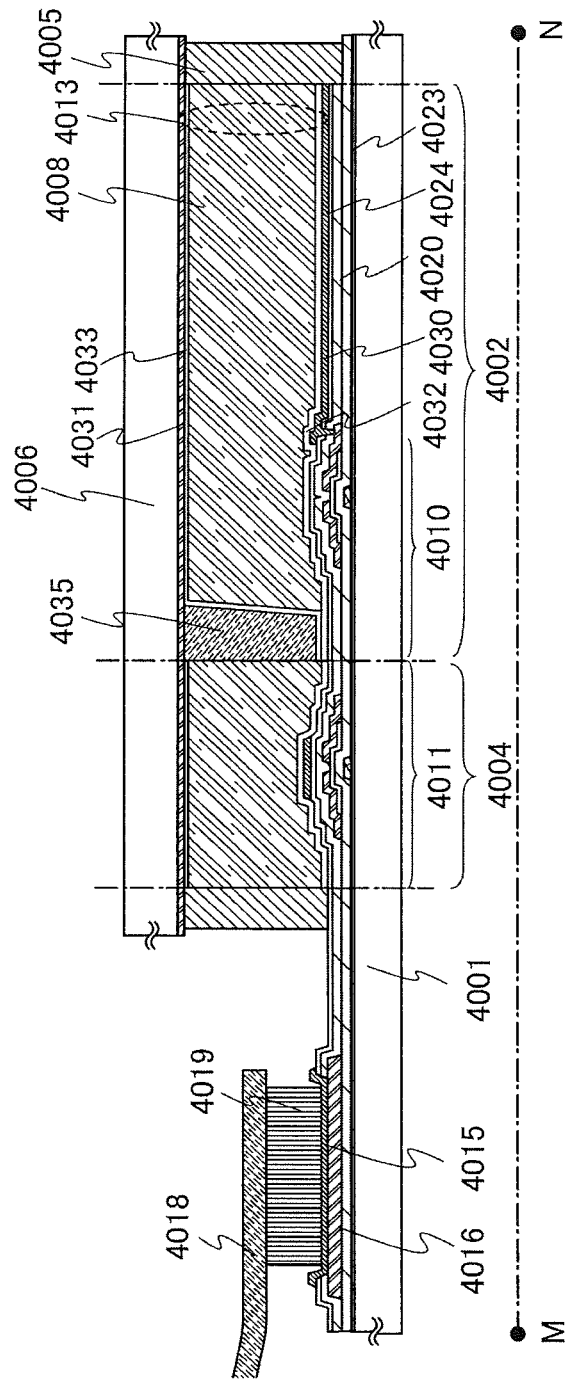
FIG. 6 illustrates one embodiment of a semiconductor device.
Figure 7:
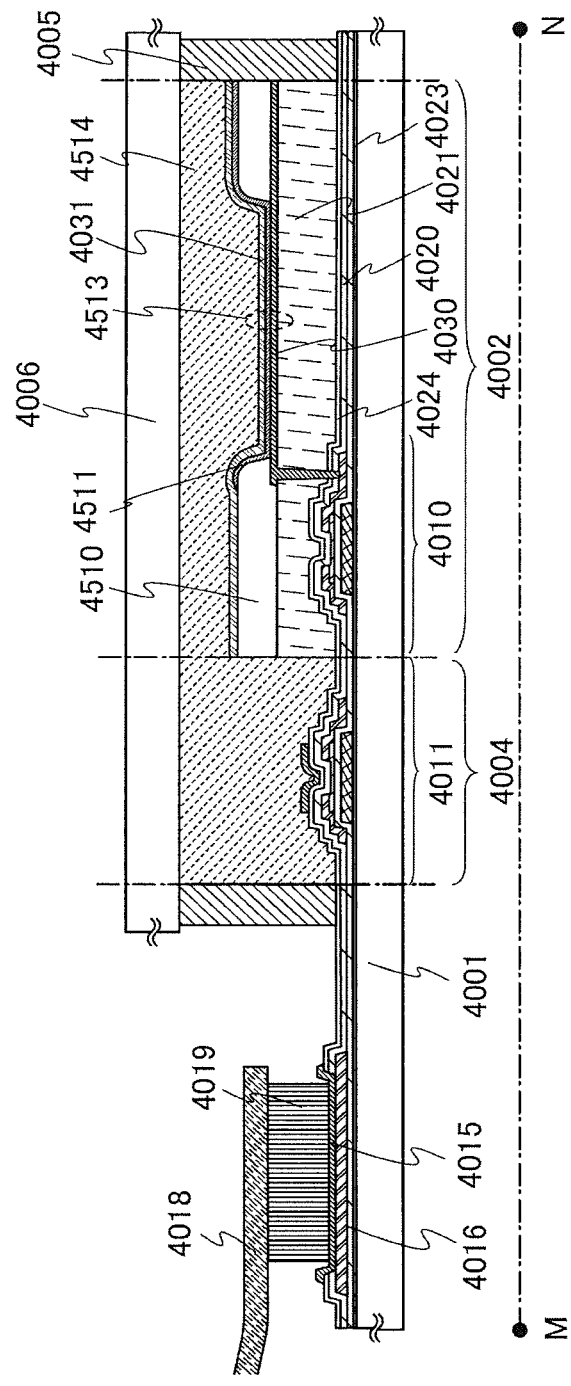
FIG. 7 illustrates one embodiment of a semiconductor device.
Figure 8:
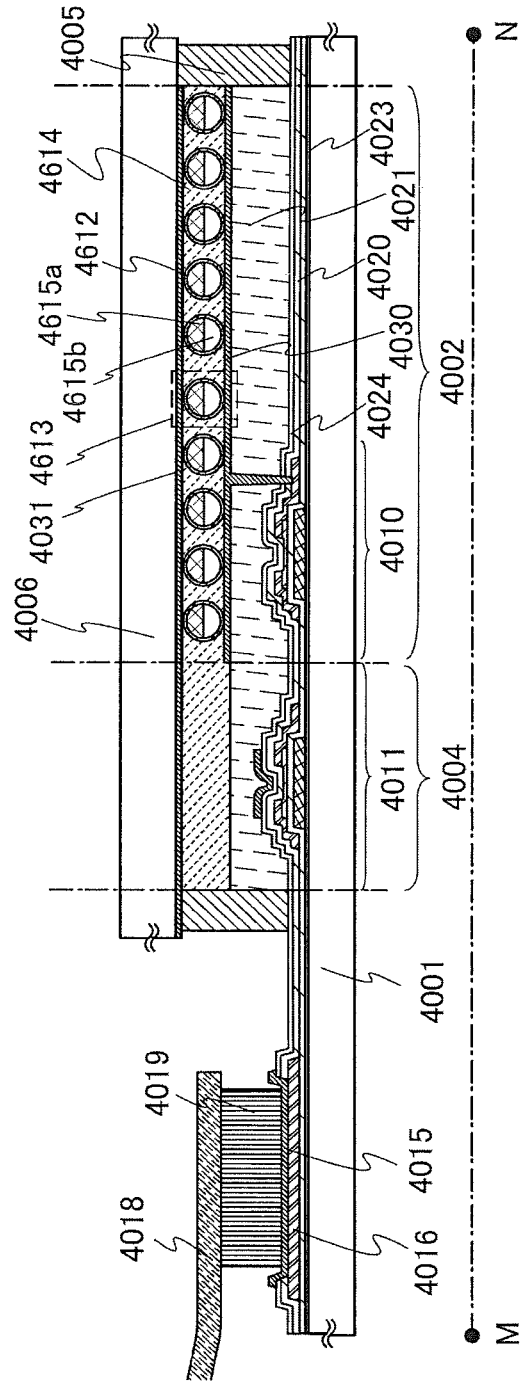
FIG. 8 illustrates one embodiment of a semiconductor device.

An embodiment of the semiconductor device is described with reference to FIGS. 6 to 8. FIGS. 6 to 8 correspond to cross-sectional views along line M-N in FIG. 12B.

As illustrated in FIGS. 6 to 8, the semiconductor device includes a connection terminal electrode 4015 and a terminal electrode 4016. The connection terminal electrode 4015 and the terminal electrode 4016 are electrically connected to a terminal included in the FPC 4018 via an anisotropic conductive film 4019.

The connection terminal electrode 4015 is formed using the same conductive film as a first electrode layer 4030, and the terminal electrode 4016 is formed using the same conductive film as source and drain electrodes of a transistor 4010 and a transistor 4011.

The pixel portion 4002 and the scan line driver circuit 4004 which are provided over the first substrate 4001 include a plurality of transistors. In FIGS. 6 to 8, the transistor 4010 included in the pixel portion 4002 and the transistor 4011 included in the scan line driver circuit 4004 are illustrated as an example. In FIG. 6, insulating films 4020 and 4024 are provided over the transistor 4010 and the transistor 4011. In FIGS. 7 and 8, an insulating layer 4021 is further provided. An insulating film 4023 is an insulating film functioning as a base film.

In this embodiment, any transistors described in Embodiments 1 to 3 can be applied to the transistor 4010 and the transistor 4011. Variation in electric characteristics of the transistor 4010 and the transistor 4011 is suppressed and the transistor 4010 and the transistor 4011 are electrically stable. Accordingly, highly reliable semiconductor devices can be provided as the semiconductor devices illustrated in FIGS. 6 to 8.

In addition, in this embodiment, a conductive layer is provided over the insulating layer so as to overlap with a channel formation region of an oxide semiconductor film in the transistor 4011 for the driver circuit. By providing the conductive layer so as to overlap with the channel formation region of the oxide semiconductor film, the amount of change in the threshold voltage of the transistor 4011 by the BT test can be further reduced. The potential of the conductive layer may be the same as or different from that of a gate electrode of the transistor 4011, and the conductive layer can be functioned as a second gate electrode. The potential of the conductive layer may be GND, 0V, or in a floating state.

The conductive layer also functions to block an external electric field, that is, to prevent an external electric field (particularly, to prevent static electricity) from effecting the inside (a circuit portion including a transistor). The blocking function of the conductive layer enables the variation in electrical characteristics of the transistor due to the effect of external electric field such as static electricity to be prevented.

The transistor 4010 provided in the pixel portion 4002 is electrically connected to the display element in a display panel. A variety of display elements can be used as the display element as long as display can be performed.

An example of a liquid crystal display device using a liquid crystal element as the display element is described in FIG. 6. In FIG. 6, a liquid crystal element 4013 which is a display element includes the first electrode layer 4030, the second electrode layer 4031, and a liquid crystal layer 4008. An insulating film 4032 and an insulating film 4033 which serve as alignment films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer obtained by selective etching of an insulating film and is provided in order to control the thickness (a cell gap) of the liquid crystal layer 4008. Note the spacer is not limited to a columnar spacer, and, for example, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 weight percent or more of a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1\times10^9$ Ω·cm or more, preferably $1\times10^{11}$ Ω·cm or more, far preferably $1\times10^{12}$ Ω·cm or more. The value of the specific resistivity in this specification is measured at 20° C.

The size of a storage capacitor formed in the liquid crystal display device is set considering the leakage current of the transistor provided in the pixel portion or the like so that electrical charge can be held for a predetermined period. By using the transistor including the highly purified oxide semiconductor film, it is enough to provide a storage capacitor having a capacitance that is ⅓ or less, preferably ⅕ or less of a liquid crystal capacitance of each pixel.

In the transistor used in this embodiment, which includes the highly purified oxide semiconductor film, the current in an off state (the off-state current) can be made small. Accordingly, an electrical signal such as an image signal can be held for a long period, and a writing interval can be set long in a state where power is being supplied. Accordingly, the frequency of refresh operation can be reduced, which leads to an effect of suppressing power consumption.

In addition, the transistor including the highly purified oxide semiconductor film used in this embodiment can have relatively high field-effect mobility and thus is capable of high speed operation. Therefore, by using the transistor in the pixel portion of the liquid crystal display device, a high-quality image can be displayed. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device employing a vertical alignment (VA) mode may be used. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, or the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be provided with a polarizing substrate and a retardation substrate. In addition, a backlight, a side light, or the like may be used as the light source.

In addition, it is possible to employ a time-division display method (a field-sequential driving method) with the use of a plurality of light-emitting diodes (LEDs) as a backlight. A field-sequential driving method enables color display without using a color filter.

As a display method in the pixel portion, a progressive method, an interlace method or the like can be employed. Further, color elements controlled in a pixel for color display are not limited to three colors of R, G, and B (R, G, and B correspond to red, green, and blue, respectively). For example, the following can be used: R, G, B, and W (W corresponds to white); or R, G, B, and one or more of yellow, cyan, magenta, and the like. The sizes of display regions may be different between respective dots of the color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified depending on whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified depending on the element structure into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. An example using an organic EL element as a light-emitting element is described here.

In order to extract light emitted from the light-emitting element, at least one of a pair of electrodes is transparent. The transistor and the light-emitting element are provided over the substrate. The light-emitting element have the following emission structure: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

An example of a light-emitting device in which a light-emitting element is used as the display element is illustrated in FIG. 7. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is shown in FIG. 7. The structure of the light-emitting element 4513 can be changed as appropriate depending on a direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode layer 4030 so that the sidewall of the opening has a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a diamond like carbon (DLC) film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate for a light-emitting surface of the light-emitting element. Further, the polarizing plate or the circularly polarizing plate may be provided with an anti-reflection film. For example, anti-glare treatment by which reflected light can be diffused by surface roughness so as to reduce the glare can be performed.

Further, an electronic paper in which electronic ink is driven can be provided as the display device. The electronic paper is also called an electrophoretic display device (electrophoretic display) and has advantages in that it exhibits the same level of readability as regular paper, it exhibits less power consumption than other display devices, and it can be in a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (one of which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles containing a pigment, color display can also be achieved.

The first particles and the second particles in the microcapsules may be formed of one kind of material selected from a conductive material, an insulating material, a semiconductor material, a magnetic material, a liquid crystal material, a ferroelectric material, an electroluminescent material, an electrochromic material, and a magnetophoretic material, or a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 8 illustrates active matrix electronic paper as an embodiment of a semiconductor device. The electronic paper shown in FIG. 8 is an example of a display device using the twisting ball display system.

Between the first electrode layer 4030 connected to the transistor 4010 and the second electrode layer 4031 provided for the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIGS. 6 to 8, a flexible substrate as well as a glass substrate can be used as any of the first substrate 4001 and the second substrate 4006. For example, a plastic substrate having light-transmitting properties can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating film 4020 can be formed using an inorganic insulating material such as silicon oxide, silicon oxynitride, hafnium oxide, aluminum oxide, or gallium oxide. A manufacturing method of the insulating film 4020 is not particularly limited; for example, a film formation method such as a plasma CVD method or a sputtering method can be used. The sputtering method is preferable in that hydrogen, water, and the like are unlikely to enter a film to be formed.

The insulating film 4024 can be formed with a single-layer structure or a multi-layer structure using one or more of a silicon nitride film, a silicon nitride oxide film, an aluminum oxide film, an aluminum nitride film, an aluminum oxynitride film, and an aluminum nitride oxide film by a sputtering method. The insulating film 4024 functions as a protective film of the transistor(s).

The insulating layer 4021 can be formed using an inorganic insulating material or an organic insulating material.

The insulating layer 4021 may be formed using a heat-resistant organic insulating material such as an acrylic resin, polyimide, a benzocyclobutene-based resin, polyamide, or an epoxy resin, which is preferable as a planarizing insulating film. As well as such an organic insulating material, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021; the insulating layer 4021 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device displays an image by transmitting light from the light source or the display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

Any of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Any of the first electrode layer 4030 and the second electrode layer 4031 can be formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

Since the transistor is easily broken owing to static electricity or the like, a protective circuit for protecting the driver circuit is preferably provided. The protective circuit is preferably formed using a non-linear element.

In this manner, by using any of the transistors described in Embodiments 1 to 3, a highly reliable semiconductor device can be provided.

Embodiment 5 can be implemented in appropriate combination with any of the structures described in the other embodiments.

(Embodiment 6)

A semiconductor device having an image sensor function for reading data of an object can be manufactured with the use of any transistor exemplified in Embodiments 1 to 3.

Figure 9A:
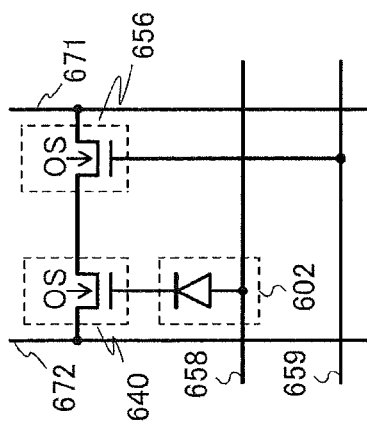
FIGS. 9A and 9B illustrate one embodiment of a semiconductor device.

An example of a semiconductor device having an image sensor function is illustrated in FIG. 9A. FIG. 9A illustrates an equivalent circuit of a photo sensor, and FIG. 9B is a cross-sectional view illustrating part of the photo sensor.

One electrode of a photodiode 602 is electrically connected to a photodiode reset signal line 658, and the other electrode thereof is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted with a symbol "OS" so that it can be identified as a transistor including an oxide semiconductor film. The transistor 640 and the transistor 656 in FIG. 9A are transistors each including an oxide semiconductor film.

Figure 9B:
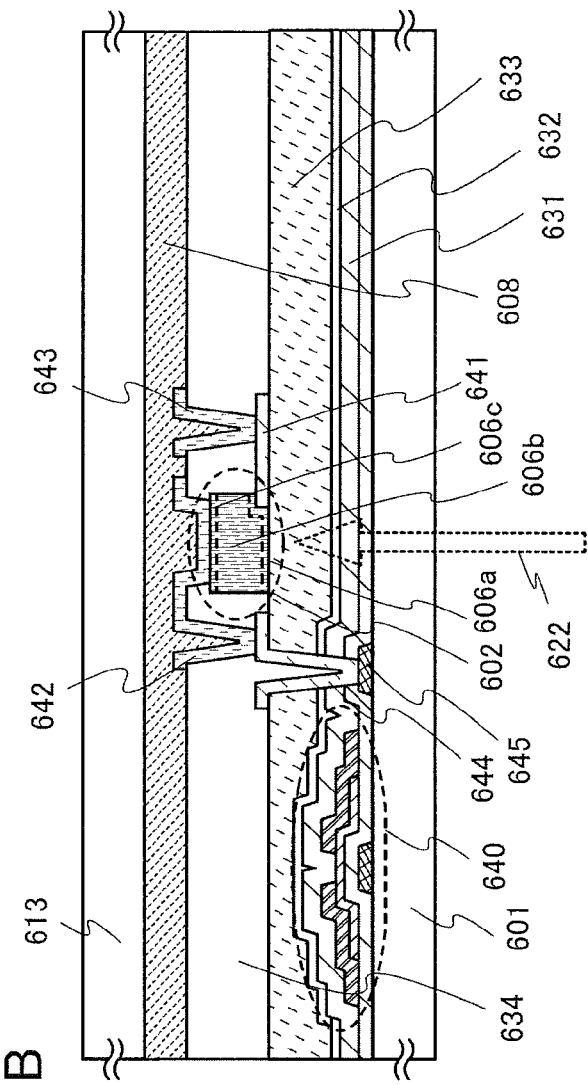

FIG. 9B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with the use of an adhesion layer 608.

An insulating film 631, a protective insulating film 632, a first interlayer insulating layer 633, and a second interlayer insulating layer 634 are provided over the transistor 640. The photodiode 602 is provided over the first interlayer insulating layer 633. In the photodiode 602, a first semiconductor layer 606a, a second semiconductor layer 606b, and a third semiconductor layer 606c are stacked in this order over the first interlayer insulating layer 633 between an electrode layer 641 provided over the first interlayer insulating layer 633 and an electrode layer 642 provided over the second interlayer insulating layer 634.

In this embodiment, any of the transistors described in Embodiments 1 to 3 can be applied to the transistor 640. In the transistor 640 and the transistor 656, variation in electrical characteristics is suppressed, and the transistor 640 and the transistor 656 are electrically stable. Accordingly, a highly reliable semiconductor device can be provided as the semiconductor device of this embodiment described in FIGS. 9A and 9B.

The electrode layer 641 is electrically connected to a conductive layer 643 formed over the second interlayer insulating layer 634, and the electrode layer 642 is electrically connected to a gate electrode 645 through a electrode layer 644. The gate electrode 645 is electrically connected to the gate electrode of the transistor 640, and the photodiode 602 is electrically connected to the transistor 640.

Here, a pin photodiode in which a semiconductor layer having a p-type conductivity as the first semiconductor layer 606a, a high-resistance semiconductor layer (i-type semiconductor layer) as the second semiconductor layer 606b, and a semiconductor layer having an n-type conductivity as the third semiconductor layer 606c are stacked is illustrated as an example.

The first semiconductor layer 606a is a p-type semiconductor layer and can be formed using an amorphous silicon film containing an impurity element imparting the p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion implantation method. Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The first semiconductor layer 606a is preferably formed to have a thickness greater than or equal to 10 nm and less than or equal to 50 nm.

The second semiconductor layer 606b is an i-type semiconductor layer (intrinsic semiconductor layer) and is formed using an amorphous silicon film. As for formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be formed by an LPCVD method, a chemical vapor deposition method, a sputtering method, or the like. The second semiconductor layer 606b is preferably formed to have a thickness greater than or equal to 200 nm and less than or equal to 1000 nm.

The third semiconductor layer 606c is an n-type semiconductor layer and is formed using an amorphous silicon film containing an impurity element imparting the n-type conductivity. The third semiconductor layer 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion implantation method. Heating or the like may be conducted after introducing the impurity element by an ion injecting method or the like in order to diffuse the impurity element. In that case, as a method of forming the amorphous silicon film, an LPCVD method, a chemical vapor deposition method, a sputtering method, or the like may be used. The third semiconductor layer 606c is preferably formed to have a thickness greater than or equal to 20 nm and less than or equal to 200 nm.

Any of the first semiconductor layer 606a, the second semiconductor layer 606b, and the third semiconductor layer 606c is not necessarily formed using an amorphous semiconductor, and may be formed using a polycrystalline semiconductor, or a micro crystalline semiconductor (a semi-amorphous semiconductor: SAS).

The microcrystalline semiconductor belongs to a metastable state of an intermediate between amorphous and single crystalline, considering Gibbs free energy. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, that is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. The semiconductor contains hydrogen or halogen of at least 1 at. % to terminate a dangling bond. Moreover, microcrystalline silicon is made to contain a rare gas element such as helium, neon, argon, or krypton to further enhance lattice distortion, whereby stability is increased and a favorable microcrystalline semiconductor film can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed by using a gas obtained by diluting $SiH_4$, $Si_2H_6$, $SiH_2Cl_2$, $SiHCl_3$, $SiCl_4$, or $SiF_4$, with hydrogen. Further, with a dilution with one or plural kinds of rare gas elements selected from helium, neon, argon, and krypton in addition to silicon hydride and hydrogen, the microcrystalline semiconductor film can be formed. In that case, the flow ratio of hydrogen to silicon hydride is 5:1 to 200:1, preferably 50:1 to 150:1, far preferably 100:1. Further, a hydrocarbon gas such as $CH_4$ or $C_2H_6$, a gas containing germanium such as $GeH_4$ or $GeF_4$, $F_2$, or the like may be mixed into the gas containing silicon.

In addition, since the mobility of holes generated by a photoelectric effect is lower than that of electrons, a pin photodiode exhibits better characteristics when a surface on the p-type semiconductor layer side is used as a light-receiving plane. Here, an example in which light 622 received by the photodiode 602 from a surface of the substrate 601, over which the pin photodiode is formed, is converted into electric signals is described. Further, light from the semiconductor layer having a conductivity type opposite from that of the semiconductor layer on the light-receiving plane is disturbance light; therefore, the electrode layer 642 on the semiconductor layer having the opposite conductivity type is preferably formed from a light-blocking conductive film. Note that a surface on the n-type semiconductor layer side can alternatively be used as the light-receiving plane.

For reduction of the surface roughness, an insulating layer functioning as a planarizing insulating film is preferably used as any of the first interlayer insulating layer 633 and the second interlayer insulating layer 634. Any of the first interlayer insulating layer 633 and the second interlayer insulating layer 634 can be formed using, for example, an organic insulating material such as polyimide, an acrylic resin, a benzocyclobutene-based resin, polyamide, or an epoxy resin. As well as such an organic insulating material, it is possible to use a single layer or multi layers of a low-dielectric constant material (a low-k material), a siloxane-based resin, phosphosilicate glass (PSG), borophosphosilicate glass (BPSG), or the like.

Any of the insulating film 631, the protective insulating film 632, the first interlayer insulating layer 633, and the second interlayer insulating layer 634 can be formed using an insulating material by a sputtering method, a spin coating method, a dipping method, spray coating, a droplet discharge method (e.g., an inkjet method, screen printing, or offset printing), roll coating, curtain coating, knife coating, or the like depending on the material.

With detection of light that enters the photodiode 602, data on an object to be detected can be read. A light source such as a backlight can be used for the data reading on the object.

Any of the transistors exemplified in Embodiments 1 to 3 can be used as the transistor 640. The transistor including the oxide semiconductor film which is highly purified by removing impurities such as hydrogen, moisture, a hydroxyl group, or hydride (also referred to as a hydrogen compound) and contains excessive oxygen supplied by oxygen doping or the like whose variation in the electric characteristics is suppressed is electrically stable. Accordingly, a highly reliable semiconductor device can be provided.

Embodiment 6 can be implemented in appropriate combination with any of the structures described in the other embodiments.

(Embodiment 7)

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the liquid crystal display device described in the above embodiment will be described below.

Figure 10A:
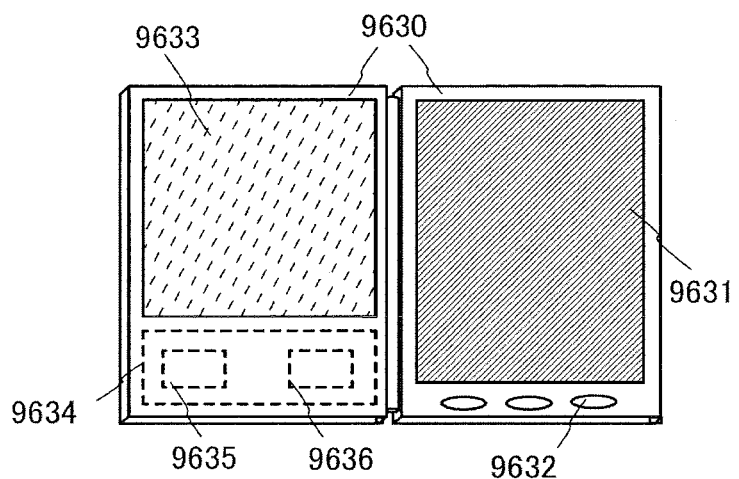
FIGS. 10A and 10B illustrate electronic equipment.

FIG. 10A illustrates an electronic book reader (also referred to as an e-book reader) which can include housings 9630, a display portion 9631, operation keys 9632, a solar cell 9633, and a charge and discharge control circuit 9634. The electronic book reader illustrated in FIG. 10A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. In FIG. 10A, the charge and discharge control circuit 9634 has a battery 9635 and a DCDC converter (hereinafter, abbreviated as a converter) 9636. Any of the semiconductor devices described in the above embodiments can be applied to the display portion 9631, whereby a highly reliable electronic book reader can be provided.

In the case where a transflective liquid crystal display device or a reflective liquid crystal display device is used as the display portion 9631, use under a relatively bright condition is assumed; therefore, the structure illustrated in FIG. 10A is preferable because power generation by the solar cell 9633 and charge with the battery 9635 are effectively performed. Since the solar cell 9633 can be provided in a space (a surface or a rear surface) of the housing 9630 as appropriate, the battery 9635 can be efficiently charged, which is preferable. A lithium ion battery may be used as the battery 9635, which provides an advantage of downsizing or the like.

Figure 10B:
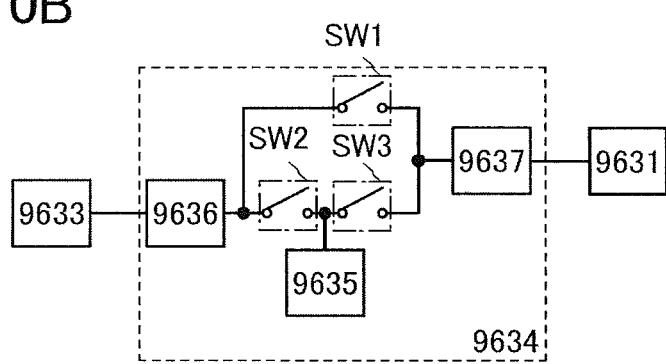

The structure and the operation of the charge and discharge control circuit 9634 illustrated in FIG. 10A are described with reference to a block diagram of FIG. 10B. The solar cell 9633, the battery 9635, the converter 9636, a converter 9637, switches SW1 to SW3, and the display portion 9631 are shown in FIG. 10B, and the battery 9635, the converter 9636, the converter 9637, and the switches SW1 to SW3 are included in the charge and discharge control circuit 9634.

First, an example of operation in the case where power is generated by the solar cell 9633 using external light is described. The voltage of power generated by the solar cell is raised or lowered by the converter 9636 to a voltage for charging the battery 9635. Then, when the power from the solar cell 9633 is used for the operation of the display portion 9631, the switch SW1 is turned on and the voltage of the power is raised or lowered by the converter 9637 to a voltage needed for the display portion 9631. In addition, when display on the display portion 9631 is not performed, for example, the switch SW1 is turned off and the switch SW2 is turned on so that charge of the battery 9635 is performed.

Next, operation in the case where power is not generated by the solar cell 9633 using external light is described. The voltage of power accumulated in the battery 9635 is raised or lowered by the converter 9637 with the switch SW3 turned on. Then, power from the battery 9635 is used for the operation of the display portion 9631.

Although the solar cell 9633 is described as an example of a means for charging, the battery 9635 may be charged with another means. The solar cell 9633 may be combined with another means for charging.

Figure 11A:
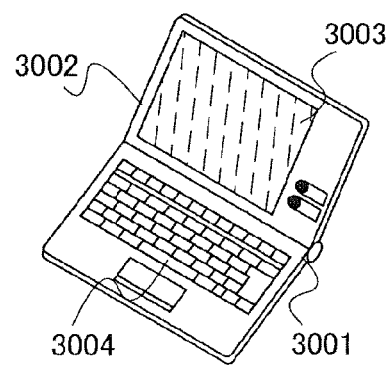
FIGS. 11A to 11F illustrate electronic equipment.

FIG. 11A illustrates a laptop personal computer, which includes a main body 3001, a housing 3002, a display portion 3003, a keyboard 3004, and the like. By applying any of the semiconductor devices described in the above embodiments to the display portion 3003, a highly reliable laptop personal computer can be provided.

Figure 11B:
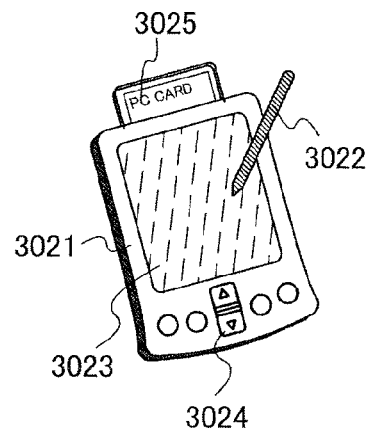

FIG. 11B is a personal digital assistant (PDA), which includes a main body 3021 provided with a display portion 3023, an external interface 3025, operation buttons 3024, and the like. A stylus 3022 is included as an accessory for operation. By applying any of the semiconductor devices described in the above embodiments to the display portion 3023, a highly reliable personal digital assistant (PDA) can be provided.

Figure 11C:
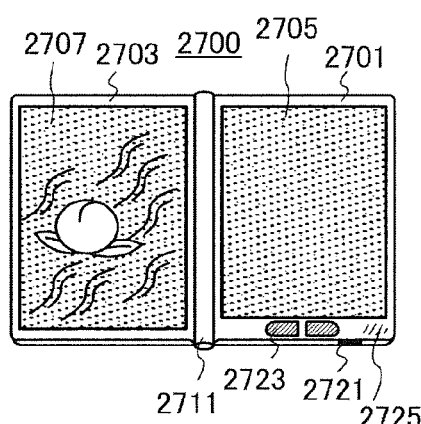

FIG. 11C illustrates an example of an electronic book reader. For example, an electronic book reader 2700 includes two housings, i.e., a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 11C) displays text and the left display portion (the display portion 2707 in FIG. 11C) displays images. By applying any of the semiconductor devices described in the above embodiments to the display portion 2705, 2707, a highly reliable electronic book reader can be provided as the electronic book reader 2700.

FIG. 11C illustrates an example in which the housing 2701 is provided with an operation portion and the like. For example, the housing 2701 is provided with a power switch 2721, operation keys 2723, a speaker 2725, and the like. With the operation keys 2723, pages can be turned. A keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may be equipped with a function of an electronic dictionary.

The electronic book reader 2700 may have a structure capable of wirelessly transmitting and receiving data. Through wireless communication, book data or the like can be purchased and downloaded from an electronic book server.

Figure 11D:
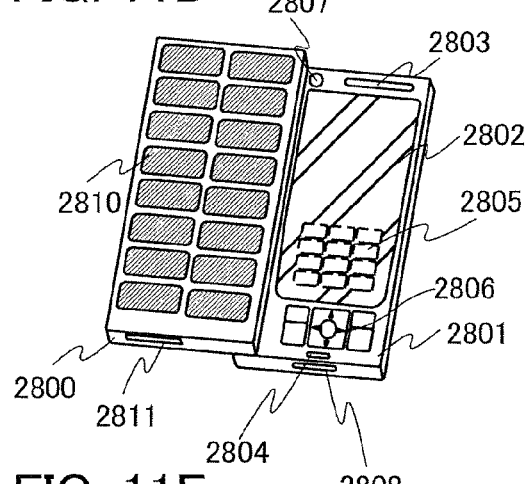

FIG. 11D illustrates a mobile phone, which includes two housings, i.e., a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charging the mobile phone, an external memory slot 2811, and the like. An antenna is incorporated in the housing 2801. By applying any of the semiconductor devices described in the above embodiments to the display panel 2802, a highly reliable mobile phone can be provided.

Further, the display panel 2802 is provided with a touch panel. A plurality of operation keys 2805 which is displayed as images is illustrated by dashed lines in FIG. 11D. A boosting circuit by which a voltage output from the solar cell 2810 is increased to be sufficiently high for each circuit is also provided.

On the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Furthermore, the housings 2800 and 2801 which are developed as illustrated in FIG. 11D can overlap with each other by sliding; thus, the size of the mobile phone can be decreased, which makes the mobile phone suitable for being carried.

The external connection terminal 2808 can be connected to an AC adapter and various types of cables such as a USB cable, and charging and data communication with a personal computer are possible. Moreover, a large amount of data can be stored and moved with a storage medium inserted into the external memory slot 2811.

Further, in addition to the above functions, an infrared communication function, a television reception function, or the like may be equipped.

Figure 11E:
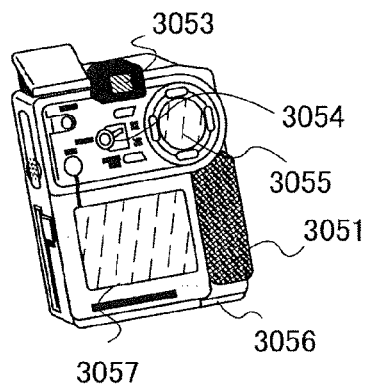

FIG. 11E illustrates a digital video camera which includes a main body 3051, a display portion A 3057, an eyepiece portion 3053, an operation switch 3054, a display portion B 3055, a battery 3056, and the like. By applying any of the semiconductor devices described in the above embodiments to the display portion A 3057 and/or the display portion B 3055, a highly reliable digital video camera can be provided.

Figure 11F:
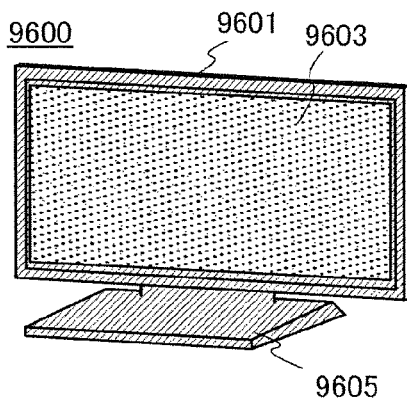

FIG. 11F illustrates an example of a television device. In a television set 9600, a display portion 9603 is incorporated in a housing 9601. The display portion 9603 can display images. In FIG. 11F, the housing 9601 is supported by a stand 9605. By applying any of the semiconductor devices described in the above embodiments to the display portion 9603, a high reliable television set can be provided as the television set 9600.

The television set 9600 can be operated by an operation switch of the housing 9601 or a separate remote controller. Further, the remote controller may be provided with a display portion for displaying data output from the remote controller.

The television set 9600 is provided with a receiver, a modem, and the like. With the receiver, general television broadcasting can be received. Moreover, when the display device is connected to a communication network with or without wires via the modem, one-way (from sender to receiver) or two-way (between sender and receiver or between receivers) data communication can be performed.

Embodiment 7 can be implemented in appropriate combination with any of the structures described in the other embodiments.

This application is based on Japanese Patent Application serial No. 2010-100316 filed with Japan Patent Office on Apr. 23, 2010, the entire contents of which are hereby incorporated by reference.

EXPLANATION OF REFERENCE

10: plasma apparatus; 11: substrate chamber; 12: load lock chamber; 13: transfer chamber; 14: cassette port; 15: vacuum chamber; 16: ICP coil; 17: gas flow pass; 18: high-frequency power source; 19: substrate stage; 20: process substrate; 21: high-frequency power source; 22: automatic pressure control valve; 23: turbo molecular pump; 24: dry pump; 400: substrate; 401: gate electrode layer; 402: gate insulating film; 402a: gate insulating film; 402b: gate insulating film; 403: oxide semiconductor film; 404a: metal oxide region; 404b: metal oxide region; 405a: source electrode layer; 405b: drain electrode layer; 407: insulating film; 408: insulating film; 409: insulating film; 410: transistor; 420: transistor; 421: oxygen; 421a: oxygen; 421b: oxygen; 421c: oxygen; 427: insulating layer; 430: transistor; 440: transistor; 441: oxide semiconductor film; 450: transistor; 455a: opening; 455b: opening; 456a: conductive layer; 456b: conductive layer; 460: transistor; 470: transistor; 601: substrate; 602: photodiode; 606a: semiconductor layer; 606b: semiconductor layer; 606c: semiconductor layer; 608: adhesion layer; 613: substrate; 631: insulating film; 632: protective insulating film; 633: interlayer insulating layer; 634: interlayer insulating layer; 640: transistor; 641: electrode layer; 642: electrode layer; 643: conductive layer; 644: electrode layer; 645: gate electrode; 656: transistor; 658: photodiode reset signal line; 659: gate signal line; 671: photosensor output signal line; 672: photosensor reference signal line; 900: solid line; 901: dotted line; 902: solid line; 903: dotted line; 2700: electronic book reader; 2701: housing; 2703: housing; 2705: display portion; 2707: display portion; 2711: hinge; 2721: power switch; 2723: operation key; 2725: speaker; 2800: housing; 2801: housing; 2802: display panel; 2803: speaker; 2804: microphone; 2805: operation key; 2806: pointing device; 2807: camera lens; 2808: external connection terminal; 2810: solar cell; 2811: external memory slot; 3001: main body; 3002: housing; 3003: display portion; 3004: key board; 3021: main body; 3022: stylus; 3023: display portion; 3024: operation button; 3025: external interface; 3051: main body; 3053: eyepiece portion; 3054: operation switch; 3055: display portion B; 3056: buttery; 3057: display portion A; 4001:first substrate; 4002: pixel portion; 4003: signal line driver circuit; 4004: scan line driver circuit; 4005: sealant; 4006: second substrate; 4008: liquid crystal layer; 4010: transistor; 4011: transistor; 4013: liquid crystal element; 4015: connection terminal electrode; 4016: connection electrode; 4018: FPC; 4018a: FPC; 4018b: FPC; 4019: anisotropic conductive film; 4020: insulating film; 4021: insulating film; 4023: insulating film; 4024: insulating film; 4030: first electrode layer; 4031: second electrode layer; 4032: insulating film; 4033: insulating film; 4510: partition wall; 4511: electroluminescent layer; 4513: light-emitting element; 4514: filler; 4612: cavity; 4613: spherical particle; 4614: filler; 4615a: black region; 4615b: white region; 9600: television set; 9601: housing; 9603: display portion; 9605: stand; 9630: housing; 9631: display portion; 9632: operation key; 9633: solar cell; 9634: charge and discharge control circuit; 9635: battery; 9636: converter; 9637: converter

What is claimed is:

1. A semiconductor device comprising:
a gate electrode;
a gate insulating film formed over the gate electrode;
an oxide semiconductor film formed over the gate insulating film, wherein the oxide semiconductor film comprising a channel formation region;
a source electrode layer and a drain electrode layer formed over and in electrical contact with the oxide semiconductor film;
a first metal oxide region formed on at least a side surface of the source electrode layer;
a second metal oxide region formed on at least a side surface of the drain electrode layer; and
a second insulating film formed over the source electrode layer and the drain electrode layer,
wherein the second insulating film contacts the first metal oxide region, the second metal oxide region and at least a portion of the oxide semiconductor film between the source electrode layer and the drain electrode layer.

2. The semiconductor device according to claim 1, wherein each of the source electrode layer and the drain electrode layer comprises at least one of Al, Cr, Cu, Ta, Ti, Mo and W.

3. The semiconductor device according to claim 1, wherein each of the source electrode layer and the drain electrode layer comprises a copper film.

4. The semiconductor device according to claim 1, wherein the first metal oxide region is formed on an upper surface of the source electrode layer.

5. The semiconductor device according to claim 1, wherein the second metal oxide region is formed on an upper surface of the drain electrode layer.

6. A semiconductor device comprising:
a gate electrode;
a gate insulating film formed over the gate electrode;
an oxide semiconductor film formed over the gate insulating film, wherein the oxide semiconductor film comprising a channel formation region;
a source electrode layer and a drain electrode layer formed over and in electrical contact with the oxide semiconductor film;
a first metal oxide region formed on the source electrode layer;
a second metal oxide region formed on the drain electrode layer; and
a second insulating film formed over the source electrode layer and the drain electrode layer,
wherein the second insulating film contacts the first metal oxide region, the second metal oxide region and at least a portion of the oxide semiconductor film between the source electrode layer and the drain electrode layer.

7. The semiconductor device according to claim 6, wherein each of the source electrode layer and the drain electrode layer comprises at least one of Al, Cr, Cu, Ta, Ti, Mo and W.

8. The semiconductor device according to claim 6, wherein each of the source electrode layer and the drain electrode layer comprises a copper film.

* * * * *